(12) United States Patent
Kasukabe et al.

(10) Patent No.: US 7,423,439 B2
(45) Date of Patent: Sep. 9, 2008

(54) PROBE SHEET ADHESION HOLDER, PROBE CARD, SEMICONDUCTOR TEST DEVICE, AND MANUFACTURING METHOD OF SEMICONDUCTOR DEVICE

(75) Inventors: Susumu Kasukabe, Yokohama (JP); Teruo Shoji, Mitaka (JP); Akio Hasebe, Kodaira (JP); Yoshinori Deguchi, Inagawa (JP); Yasunori Narizuka, Hiratsuka (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/543,021

(22) Filed: Oct. 5, 2006

(65) Prior Publication Data

US 2007/0103178 A1 May 10, 2007

(30) Foreign Application Priority Data

Oct. 5, 2005 (JP) ............................ 2005-291886

(51) Int. Cl.
*G01R 31/02* (2006.01)

(52) U.S. Cl. .................................. 324/754
(58) Field of Classification Search .......... 324/754–765
See application file for complete search history.

(56) References Cited

U.S. PATENT DOCUMENTS

| 4,696,849 | A | * | 9/1987 | Mobley et al. ............... 428/95 |
| 4,774,462 | A | * | 9/1988 | Black .......................... 324/758 |
| 5,012,187 | A | * | 4/1991 | Littlebury ................... 324/754 |
| 5,623,214 | A | * | 4/1997 | Pasiecznik, Jr. ............. 324/754 |
| 5,642,054 | A | * | 6/1997 | Pasiecznik, Jr. ............. 324/754 |
| 5,818,246 | A | | 10/1998 | Zhong |
| 5,825,192 | A | * | 10/1998 | Hagihara ..................... 324/757 |
| 6,215,321 | B1 | * | 4/2001 | Nakata ........................ 324/754 |
| 6,586,955 | B2 | * | 7/2003 | Fjelstad et al. .............. 324/754 |
| 6,717,422 | B2 | * | 4/2004 | Akram ........................ 324/754 |
| 6,784,678 | B2 | * | 8/2004 | Pietzschmann ............. 324/758 |
| 7,049,837 | B2 | * | 5/2006 | Kasukabe et al. ........... 324/754 |
| 2006/0192575 | A1 | * | 8/2006 | Kasukabe et al. ........... 324/754 |
| 2007/0103178 | A1 | * | 5/2007 | Kasukabe et al. ........... 324/754 |

FOREIGN PATENT DOCUMENTS

| EP | 0 999 451 A2 | 5/2000 |
| JP | 64-071141 | 3/1989 |
| JP | 05-218150 | 8/1993 |
| JP | 08-050146 | 2/1996 |
| JP | 10-038924 | 2/1998 |
| JP | 10-308423 | 11/1998 |
| JP | 2005-024377 | 1/2005 |

* cited by examiner

*Primary Examiner*—Ha Nguyen
*Assistant Examiner*—Joshua Benitez
(74) *Attorney, Agent, or Firm*—Antonelli, Terry, Stout & Kraus, LLP.

(57) ABSTRACT

In a prove card comprising: a probe sheet having a contact terminal contacting with an electrode provided on a wafer, a wiring led from the contact terminal, and an electrode electrically connected to the wiring; and a multilayered wiring substrate having an electrode electrically connected to the electrode of the probe sheet, wherein a contact between the contact terminal and the electrode of the wafer is established by one or more adhesion holder for pressing, from the backside of a terminal group of the terminal contacts, the terminal group via a press block with a spring to contact with the electrode pad. A device in which the probe sheet is attached to the adhesion holder and a plurality of chips are tested simultaneously by combining the adhesion holder.

18 Claims, 21 Drawing Sheets

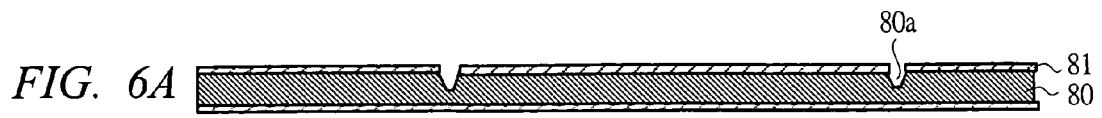
FIG. 6A
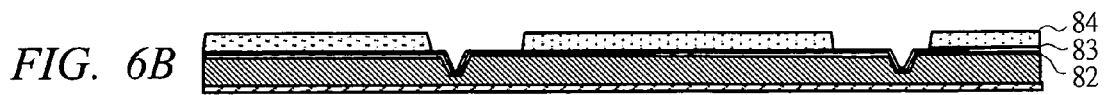
FIG. 6B
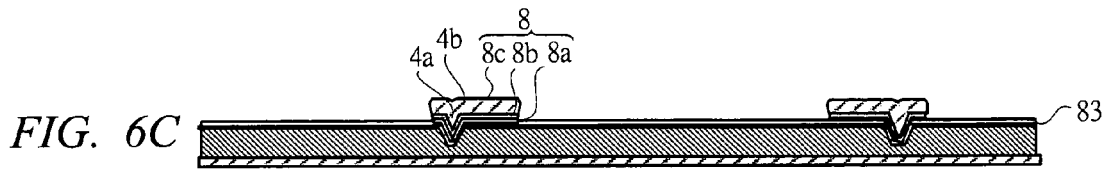
FIG. 6C
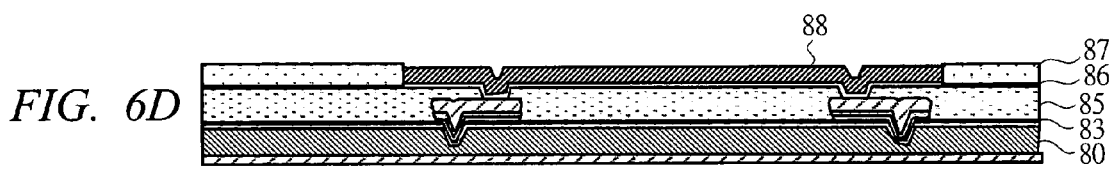
FIG. 6D
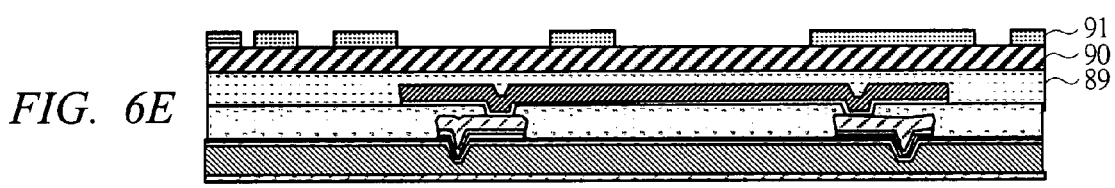
FIG. 6E
FIG. 6F
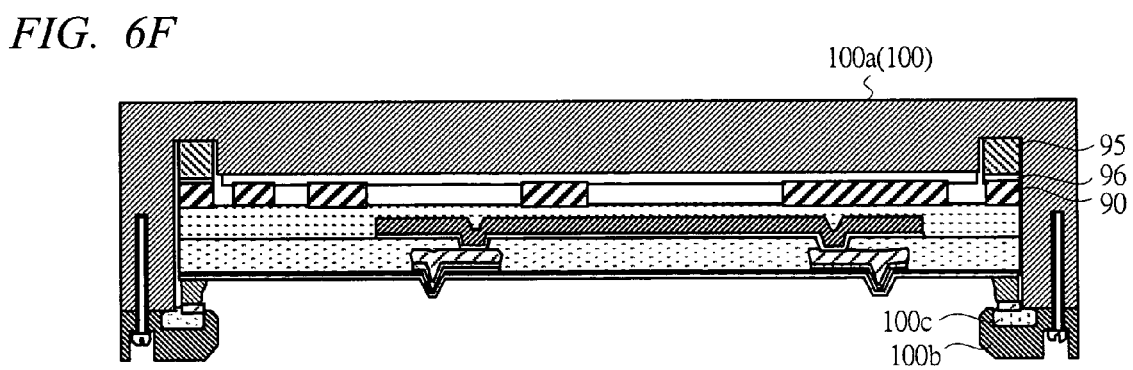
FIG. 6G
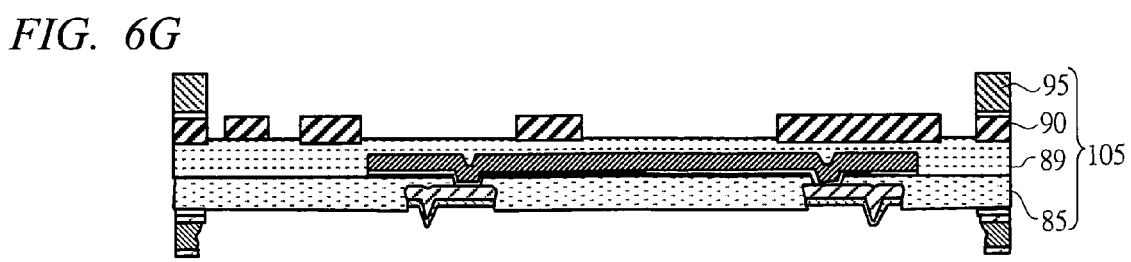

PROBE SHEET ADHESION HOLDER, PROBE CARD, SEMICONDUCTOR TEST DEVICE, AND MANUFACTURING METHOD OF SEMICONDUCTOR DEVICE

CROSS-REFERENCE TO RELATED APPLICATION

The present application claims priority from Japanese patent application No. JP 2005-291886 filed on Oct. 5, 2005, the content of which is hereby incorporated by reference into this application.

BACKGROUND OF THE INVENTION

The invention relates to a manufacturing technique of a semiconductor device. Particularly, the invention relates to a technique effectively applicable to a probe sheet adhesion holder, a probe card, a semiconductor test device, and a manufacturing method of a semiconductor device.

FIG. 19 shows an exemplary test flow performed after forming a semiconductor element circuit on a wafer in a semiconductor device manufacturing process. The figure shows an example for a package, a bear chip and a CSP that are in the form of representative shipment of the semiconductor device.

In the semiconductor device manufacturing process, mainly three tests are performed as shown in FIG. 19. First, a wafer test is conducted on a wafer to ensure conductivity and electric signal operation condition of the semiconductor elements under a wafer state of forming the semiconductor element circuits and electrodes on the wafer. Next, a burn-in test is conducted to detect a semiconductor element that has an unstable operation at high temperature or high applied voltage. Third, a selection test is conducted to ensure performance of products before shipment of the finished semiconductor devices.

A conventional test device used for testing the semiconductor device test (semiconductor test device) is as follows. A wafer has a plurality of semiconductor devices (chip) on its surface, which are cut into separate pieces for use. The semiconductor device separated in each piece has a plurality of electrodes arrayed on the surface thereof. In order to industrially manufacture the semiconductor devices and test their electric properties, a connection device comprising a probe having a tungsten needle projecting aslant from a probe card (hereinafter referred to as "conventional technique 1") is used. In the test by the connection device, contact is established by scraping against the electrode by contact pressure using bending of the probe, whereby testing the electric property of the electrode has been used.

Another conventional technique is found in Patent Document 1 (Japanese patent laid-open publication No. 64-71141) (hereinafter referred to as "conventional technique 2"). The technique uses a spring probe having pins (moving pin) on both ends thereof. That is, the moving pin on one end side of the spring probe is caused to contact with an electrode of an object to be tested (e.g. semiconductor element under the wafer state), and the moving pin on another end side is caused to contact with a terminal provided on a substrate provided on a measurement circuit side to establish electric connection for test.

Another conventional technique is described in Patent Document 2 (Japanese patent laid-open publication No. 8-50146, hereinafter referred to as "conventional technique 3"). In this technique, a contact terminal is caused to contact with an electrode of the object to be tested to establish electric connection for test. The contact terminal is formed by using a hole generated by anisotropic etching of silicon as a mold shape.

Another conventional technique is disclosed in Patent Document 3 (Japanese patent laid-open publication No. 5-218150), Patent Document 4 (Japanese patent laid-open publication No. 10-38924), Patent Document 5 (Japanese patent laid-open publication No. 10-308423), and Patent Document 6 (Japanese patent laid-open publication No. 2005-24377) (hereinafter referred to as "conventional technique 4"). The Patent Document 3 in the conventional technique 4 discloses a probe card having a structure as follows. A contactor embedding a conductive small ball in a protrusion projecting downward from a silicon rubber; and an elastic member made of silicon rubber or polyurethane and holding the area where the contactor is mounted, wherein the elastic member collectively presses the plurality of contactors.

The patent document 4 in the conventional technique 4 discloses a probe card having a structure as follows. An aperture is formed in a center of a planer wiring substrate, a wiring pattern is formed on a top surface of the substrate, and a press plate to which an elastic member is attached is mounted on the aperture to press a film substrate on which a plurality of probes are soldered from backward.

The Patent Document 5 in the conventional technique 4 discloses a probe card for an electric property test of a semiconductor element having a following structure. A frame is fixed to surround a region where contact terminals are formed, and a spring probe presses an interior of the frame via an elastomer sheet to cause a copying operation of the frame and make it contact a semiconductor element pad with desired pressure. In order to realize a probing method with a good contact property, a pyramid-shaped contact terminal is formed using an anisotropic etching hole of silicon as a mold shape, and a drawing wiring and the frame of a press mechanism are formed in an integrated manner.

Also, the patent document 6 in the conventional technique 4 discloses a manufacturing method of a semiconductor device by a thin film probe card for testing LSI having a multi-pin and a narrow pitch, wherein a triangular-pyramid-shaped contact terminal is formed for connecting to a wafer electrode and connecting to a multilayered substrate electrode; and a probe sheet provided with holes for alignment is used in a state of keeping position accuracy and film strength of a metal film.

SUMMARY OF THE INVENTION

In the above manufacturing method of a semiconductor device, for example, in the conventional technique 1, in order that the probe comprising a tungsten needle ensures a contact with a material having oxide on its material surface such as aluminum electrode or solder electrode, the contact terminal rubs off the oxide on the material surface of the electrode to contact a underlying metal conductor material thereof. Consequently, as the contact terminal rubs off the surface of the electrode material, shavings are generated from the electrode, which may cause short circuit or foreign substance between wirings. Also, as a load exceeding several hundred mN is applied to the probe to rub off the electrode in order to ensure the contact between the probe and the electrode, the electrode may be damaged. Furthermore, when wire-bonding is performed or a contact bump is formed on the electrode after probing, if the electrode surface is not smooth, resultant contact may be poor and reliability thereof may be reduced.

In the conventional technology 2, the contact terminal is formed with a mechanical structure (a spring probe having a moving pin), so that there is a problem of being unable to corresponding to the electrodes of the semiconductor element arranged at a narrow pitch.

In the conventional technology 3, meanwhile, the contact terminal is formed using an etching hole of silicon, so that it can correspond to the electrodes of the semiconductor element formed at a narrow pitch. Therefore, this structure has no problem in testing one of the semiconductor elements on the wafer.

However, when a plurality of electrodes to be tested is increased, for example, when a plurality of semiconductor elements in the wafer state are to be tested simultaneously, it becomes difficult to lead wirings from the contact terminal to the wiring substrate. Particularly, the larger the number of the contact terminal is, the larger the number of the wiring led from the contact terminal to the multilayer wiring substrate will be. For this problem, the wirings are considered to be multilayered so that the wirings from the contact terminals are not short-circuited. However, because the contact terminals are formed on the wiring layer, forming a number of wiring layers results in complication of the manufacturing process. Therefore, technical difficulty is increased.

In the conventional technique 4, the following method is used. That is, the elastic body member collectively presses the plurality of contactors, or the elastic body pushes the whole surface of a probe forming region of the probe sheet from backside thereof, or the whole of the probe forming region of the probe sheet is collectively pushed from backside thereof via the elastomer sheet. These are the methods in which the whole surface of the probe sheet is collectively pressed, so that they are different from a method according to the present invention in which the probe sheet is divided into separate blocks and each block is independently pressed.

Therefore, an object of the present invention is to provide a test device which can collectively test a plurality of semiconductor elements having a narrow-pitch electrode structure.

Also, an object of the present invention is to provide a manufacturing method of a semiconductor device, which can reduce manufacturing costs of the semiconductor device as a whole by reducing cost required for a step of testing of the semiconductor devices and which also improves throughput thereof.

These and other objects, features and advantages of the invention will be apparent from the following more particular description of preferred embodiments of the invention, as illustrated in the accompanying drawings.

Outlines of representative ones of the inventions disclosed in the present application will be briefly described as follows.

The invention realizes a probe card with a simple structure for testing a plurality of chips simultaneously by being pushed from backside of a probe sheet, wherein a probe sheet is individually and independently attached to a plurality of holders and an individual contact terminal or an individual group of contact terminals on a contact terminal region of the probe sheet is individually pressed by a spring probe or a press block having a spring. The detailed structure is as follows.

(1) A probe sheet adhesion holder comprises: a probe sheet having a contact terminal that contacts with an electrode pad provided on a wafer, a wiring led from the contact terminal, and a sheet electrode that is electrically connected to the wiring; and a holder attached to the probe sheet, wherein an interior of the holder is provided with a press member for pushing out a portion of the contact terminal of the probe sheet.

(2) A probe sheet adhesion holder comprises: a probe sheet having a contact terminal that contacts with an electrode pad provided on a wafer, a wiring led from the contact terminal, and a sheet electrode that is electrically connected to the wiring; and a holder attached to the probe sheet, wherein the holder has a rectangular shape.

(3) A probe sheet adhesion holder comprises: a probe sheet having a contact terminal that contacts an electrode pad provided on a wafer, a wiring led from the contact terminal, and a sheet electrode that is electrically connected to the wiring; and a holder attached to the probe sheet, wherein an interior of the holder is provided with a press member for pushing out a portion of the contact terminal of the probe sheet and the probe sheet is provided with a metal sheet.

(4) In the probe sheet adhesion holder according to item (3), linear expansion coefficient of the metal sheet is 1 ppm/° C. to 6 ppm/° C.

(5) In the probe sheet adhesion holder according to item (3) or (4), the metal sheet is a 42 alloy sheet.

(6) In the probe sheet adhesion holder according to any one of items (1) to (5), a dummy terminal having a larger contact area with the wafer than that with the contact terminal is provided on a surface where the contact terminal is provided.

(7) In the probe sheet adhesion holder according to any one of items (1) to (6), the contact terminal is formed using a hole formed by anisotropic etching of a crystalline substrate as a mold shape.

(8) In the probe sheet adhesion holder in item (7), the contact terminal has a triangular-pyramid shape or a truncated pyramid shape.

(9) In the probe sheet adhesion holder according to any one of items (1) to (8), at least one of a capacitor, a resistor, and a fuse is mounted on the probe sheet.

(10) A probe card comprises: a probe sheet having a contact terminal that contacts with an electrode pad provided on a wafer, a wiring led from the contact terminal, and a sheet electrode that is electrically connected to the wiring; and a multilayered wiring substrate that is electrically connected to the sheet electrode, wherein a contact between the contact terminal and the electrode pad provided on the wafer is established by one or more probe sheet adhesion holder that pressurize, from backside of a terminal group of the contact terminals, the terminal group via a built-in spring probe to contact with the electrode pad.

(11) A probe card comprises: a probe sheet having a contact terminal that contacts with an electrode pad mounted on a wafer, a wiring led from the contact terminal, and a sheet mounting connector that is electrically connected to the wiring; and a multilayered wiring substrate having a multilayered substrate mounting connector that is electrically connected to the sheet mounting connector, wherein a contact between the contact terminal and the electrode pad provided on the wafer is established by one or more probe sheet adhesion holder that pressurize, from backside of a terminal group of the contact terminals, the terminal group via a built-in spring probe to contact with the electrode pad.

(12) A probe card comprises: a probe sheet having a contact terminal that contacts with an electrode pad mounted on a wafer, and a wiring led from the contact terminal; a wiring sheet that has a wiring sheet mounting connector electrically connected to a wiring electrically connected to the wiring led from the probe sheet; and a multilayered wiring substrate having a multilayered substrate mounting connector that is electrically connected to the wiring sheet mounting connector, wherein a contact between the contact terminal and the electrode pad provided on the wafer is established by one or more probe sheet adhesion holder that pressurize, from backside of a terminal group of the contact terminals, the terminal group via a built-in spring probe to contact with the electrode pad.

(13) In the probe card according to any one of items (10) to (12), the spring probe is removable.

(14) A probe card comprises: a probe sheet having a contact terminal that contacts an electrode pad provided on a wafer, a wiring led from the contact terminal, and a sheet electrode that is electrically connected to the wiring; and a multilayered wiring substrate having a substrate electrode that is electrically connected to the sheet electrode, wherein a contact between the contact terminal and the electrode pad provided on the wafer is established by one or more probe sheet adhesion holder that pressurizes, from backside of a terminal group of the contact terminals, the group via a press block with a built-in spring to contact with the electrode pad.

(15) A probe card comprises: a probe sheet having a contact terminal that contacts with an electrode pad provided on a wafer, a wiring led from the contact terminal, and a sheet mounting connector that is electrically connected to the wiring; and a multilayered wiring substrate having a multilayered substrate mounting connector that is electrically connected to the sheet mounting connector, wherein a contact between the contact terminal and the electrode pad provided on the wafer is established by one or more probe sheet adhesion holder that pressurizes, from backside of a terminal group of the contact terminals, the group via a press block with a built-in spring to contact with the electrode pad.

(16) A probe card comprises: a probe sheet having a contact terminal that contacts with an electric pad provided on a wafer, and a wiring led from the contact terminal, a wiring sheet that has a wiring sheet mounting connector electrically connected to a wiring electrically connected to the wiring led from the probe sheet; and a multilayered wiring substrate having a multilayered substrate mounting connector that is electrically connected to the sheet mounting connector, wherein a contact between the contact terminal and the electrode pad provided on the wafer is established by one or more probe sheet adhesion holder that pressurizes, from backside of a terminal group of the contact terminals, the group via a press block with a built-in spring to contact with the electrode pad.

(17) In the probe card according to any one of items (14) to (16), the spring and the press block are removable.

(18) In the probe card according to any one of items (10) to (17), the probe sheet adhesion holder is removable.

(19) In the probe card according to any one of items (10) to (18), the contact terminal is a triangular pyramid shape or a truncated pyramid shape that is formed using a hole formed by anisotropic etching of a crystalline substrate as a mold shape.

(20) A semiconductor test device comprises: a stage on which a wafer placing a semiconductor element is loaded; a probe card contacting with a contact terminal provided on the wafer; and a tester connected to the probe card and testing an electric property of the semiconductor element, wherein the probe card is the probe card according to any one of items (10) to (19).

(21) A semiconductor device manufacturing method comprises the steps of: forming a circuit on a wafer to form a semiconductor element; testing an electric property of the semiconductor element; and dicing the wafer and separating it per semiconductor element, wherein in the step of testing the electric property of the semiconductor element, the probe card according to any one of items (10) to (19) is used to collectively test a plurality of the semiconductor elements simultaneously.

BRIEF DESCRIPTION OF THE DRAWINGS

FIG. 6A is a drawing that shows a manufacturing process of a probe sheet (structure) in the probe card according to the invention;

FIG. 6B is a drawing that shows a manufacturing process of a probe sheet (structure) in the probe card according to the invention;

FIG. 6C is a drawing that shows a manufacturing process of a probe sheet (structure) in the probe card according to the invention;

FIG. 6D is a drawing that shows a manufacturing process of a probe sheet (structure) in the probe card according to the invention;

FIG. 6E is a drawing that shows a manufacturing process of a probe sheet (structure) in the probe card according to the invention;

FIG. 6F is a drawing that shows a manufacturing process of a probe sheet (structure) in the probe card according to the invention;

FIG. 6G is a drawing that shows a manufacturing process of a probe sheet (structure) in the probe card according to the invention;

FIG. 12B1 is a cross-sectional view that shows a part of a region where a contact terminal portion is formed;

FIG. 12B2 is a plan view shown from a bottom surface as shown in FIG. 12B1;

FIG. 12C1 is a cross-sectional view that shows a part of the region where the contact terminal portion is formed;

FIG. 12C2 is a plan view shown from a bottom surface as shown in FIG. 12C1;

FIG. 13B1 is a cross-sectional view that shows a part of a region where the contact terminal portion is formed;

FIG. 13B2 is a plan view shown from a top surface as shown in FIG. 13B1;

FIG. 16D2 is a drawing that shows another manufacturing process of forming a probe sheet in the probe card according to the present invention;

DESCRIPTION OF THE PREFERRED EMBODIMENTS

Figures 1A, 1B:
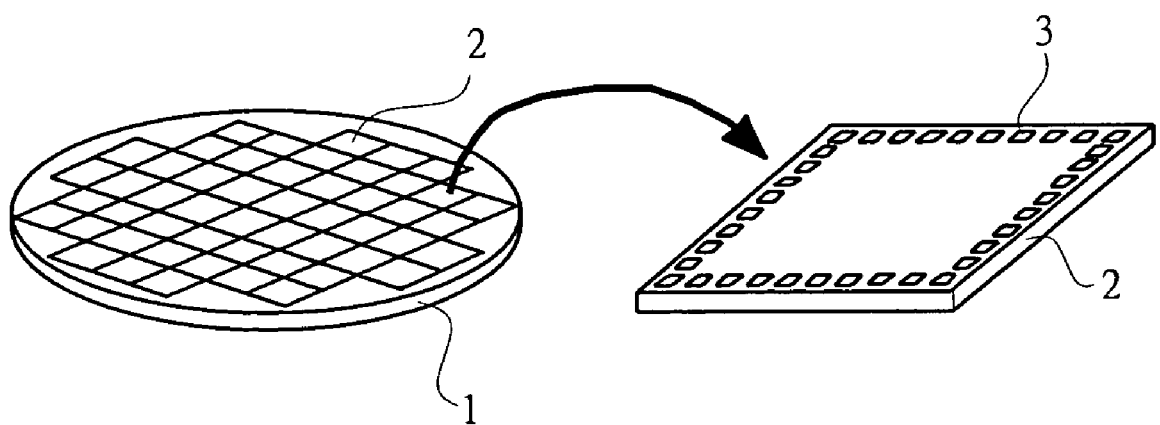
FIG. 1A is a perspective view showing a wafer that is an object to be contacted on which semiconductor elements (chip) are arranged.
FIG. 1B is a perspective view of the semiconductor element (chip)

Hereinafter, embodiments of the present invention will be detailed with reference to the accompanying drawings. Note that throughout the accompanied drawings for illustrating the embodiments of the invention, members with the same functions are denoted by the same reference numerals and repetitive description thereof will be omitted.

In this specification, major terms are defined as follows. A semiconductor device means any type of devices including a wafer state where a circuit is formed, a semiconductor element, a packaged one formed after that (e.g., QFP, BGA, CSP). A probe sheet means a thin film, which has a contact terminal contacting with an object to be tested and in which an externally connected electrode is formed on a wiring led from the contact terminal. An object of the thin film is a film with a thickness of approximately 10 μm to 100 μm. A probe card refers to a structure having a terminal that contacts with an object to be tested, and/or a multilayered wiring substrate (e.g., a structure shown in FIG. 2). A semiconductor test device means a test device having a probe card and a specimen support system on which the object to be tested is placed.

A plurality of semiconductor elements (chips) for LSI 2 that are one example of an object to be tested are, as shown in FIG. 1, formed on a wafer 1, and are separated into individual elements for use. FIG. 1A is a perspective view that shows a wafer 1 on which a plurality of semiconductor elements for LSI 2 are arrayed. FIG. 1B is an enlarged perspective view that shows the semiconductor element 2. On a peripheral of a surface of the semiconductor element 2, a plurality of electrodes 3 are formed.

Currently in the semiconductor industry, there is a tendency that the number of semiconductor elements provided on the chip and the number of electrodes 3 are ever increasing. Approximately 0.1 mm or less, 0.08 mm pitch, 0.03 mm pitch or even narrower pitch is used. Also, in order to array many electrodes, the electrodes are arranged not only one row but also in two rows. Even the electrodes may be arranged to cover the whole surface of a device.

The semiconductor element is tested at high temperature. There is a tendency that an operation test at high temperature (85° C. to 150° C.) is conducted in order to determine a property and reliability of the semiconductor element.

The semiconductor test device according to the present invention can handle electrodes arrayed with a high density and at narrow pitch. Furthermore, it enables a probing test for a plurality of chips simultaneously, and a test by a high-speed electric signal (100 MHz to several GHz). Furthermore, it uses a material having heat resistance up to 150° C. and linear expansion coefficient substantially identical to that of the object to be tested, as a constituent material for a part of the probe card in the semiconductor test device. With use of this material, the device prevents misalignment of a probe tip due to ambient temperature.

Next, a structure of a probe card according to the present invention will be described with reference to FIG. 2.

Figure 2:
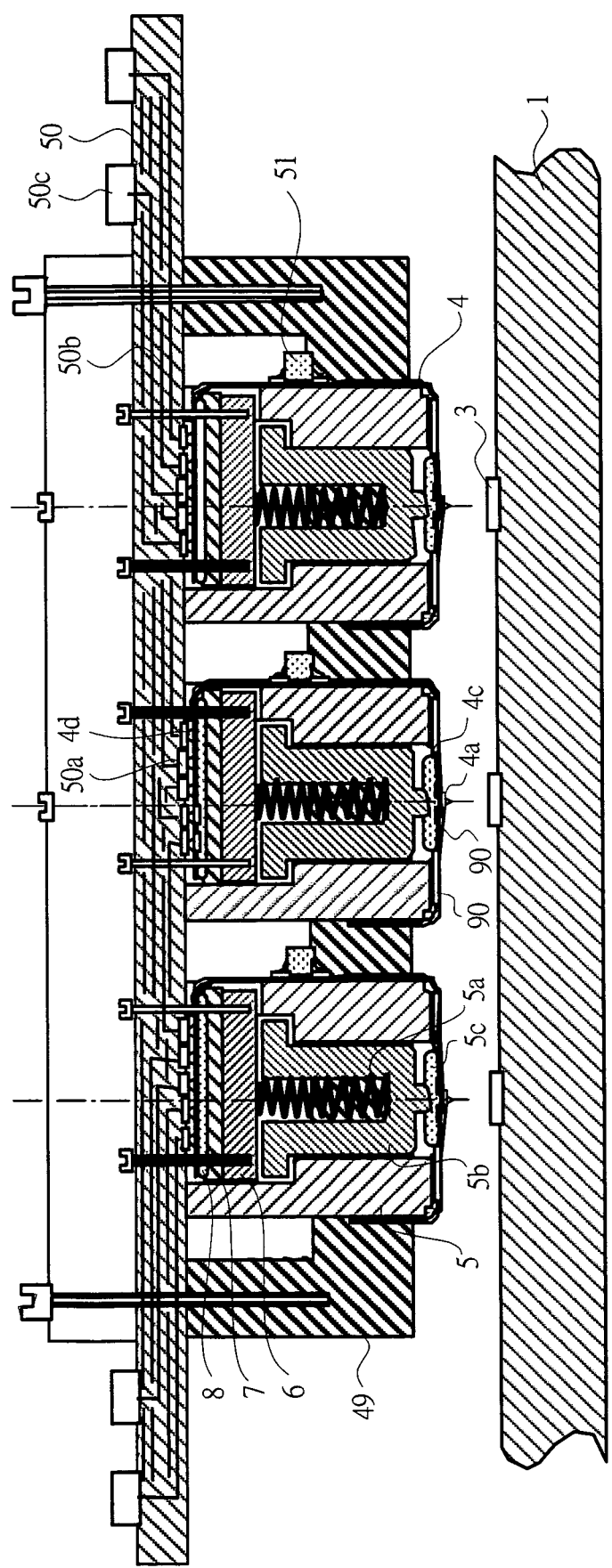
FIG. 2 is a cross-sectional view that shows a main portion of a probe card according to a first embodiment of the present invention.

FIG. 2 is a cross-sectional view that shows a main portion of the probe card according to the first embodiment of the invention. A probe sheet 4 has a contact terminal 4a, a leading wiring 4c led from the contact terminal 4a, and an electrode 4d which connects with an electrode 50a of a multilayered wiring substrate 50 via the leading wiring 4c. The probe sheet is attached to an adhesion holder 5, and the adhesion holder 5 is fixed to an adhesion holder fix plate 49. A press block 5b having a spring 5a presses a region of the contact terminal 4a from backside of the probe sheet 4 via an elastomer 5c. The probe sheet 4 having the leading wiring 4c from a side of the adhesion holder 5 is pushed out from a top surface of the contact holder 5, and an electrode 4d is connected to an electrode 50a of the multilayered wiring substrate 50.

The electrode 3 of the wafer 1 is electrically connected to the contact terminal 4a, the wiring 4c, the electrode 4d, the electrode 50*a* of the multilayered wiring substrate 50, the internal wiring 50*b*, and the electrode 50*c*, via substrate mounting components including a capacitor that prevents disturbance in the test signal of the semiconductor device, a resistor, and a fuse that blocks an excessive current from flowing through a defective semiconductor element. Preferably, to obtain these effects, the capacitor 51 is mounted as near as possible to the contact terminal. In this structure, the wiring is led from the contact terminal to connect to the electrode 50*a* provided on a multilayered wiring substrate. Thus, the capacitor 51 can be arranged on the leading wiring 4*c* at a position near to the contact terminal 4*a*. A distance from the electrode 4 to the capacitor 51 can be reduced, which makes it possible to achieve stable signals and test the semiconductor element by the high-speed electric signal. In order to reduce the length of the wiring, to mount the components on the substrate nearby, and to facilitate assembly, preferably the electrode 50*a* is formed in a region facing to the semiconductor element on the multilayered wiring substrate. The region facing to the semiconductor element on the multilayered wiring substrate refers to an upper side of the probe sheet, an upper side of the semiconductor element to be tested that is formed on the wafer, or a region corresponding thereto.

Next, a representative structure of the probe sheet 4 and the adhesion holder 5 as above will be described with reference to the FIG. 3.

Figure 3A:
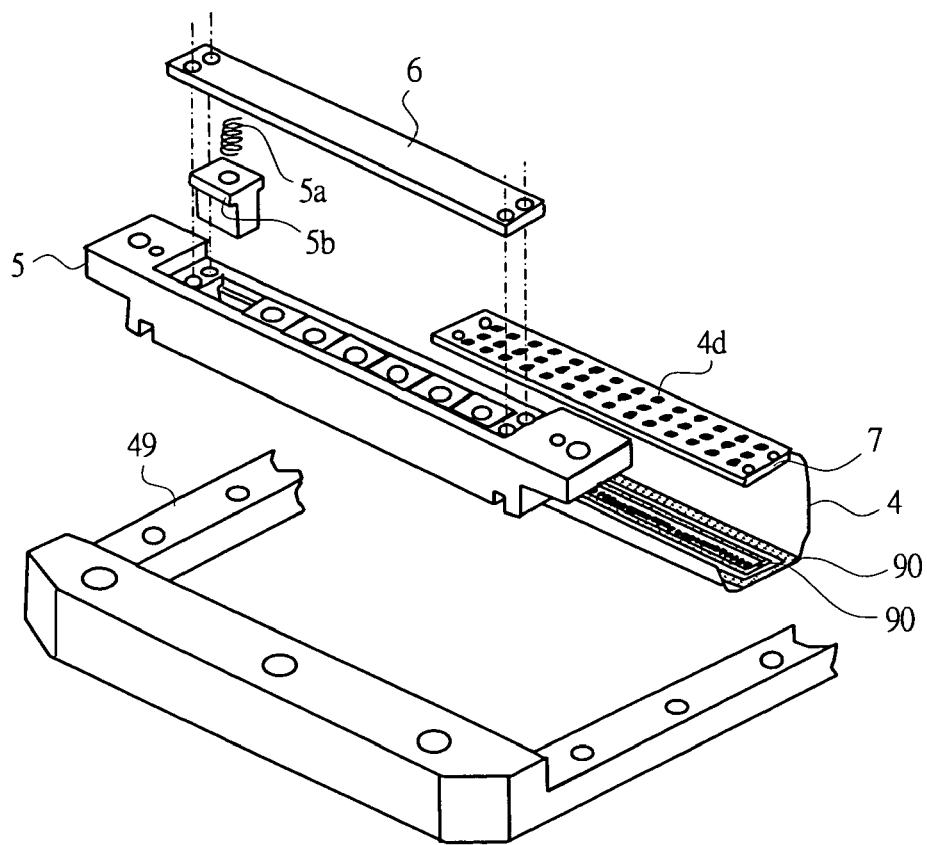
FIG. 3A is a perspective view of a structure illustrated by exploding the main portion of the probe card according to the first embodiment of the present invention as shown in FIG. 2.

FIG. 3A is a perspective view of a structure wherein a part of the adhesion holder of the FIG. 2 is exploded. A press block 5*b* and the spring 5*a* are inserted into the adhesion holder 5 having a probe sheet 4 backed up by a metal film 90 adhering thereto. A spring holding plate 6 holds the spring 5*a*. A probe sheet backside substrate 7 adhering to the backside of the probe sheet 4 is placed on the spring holding plate 6. The adhesion holder 5 is placed on a adhesion holder fixed plate 49, and fixed on the multilayered wiring substrate (not shown in the FIG. 3A).

Figure 3B:
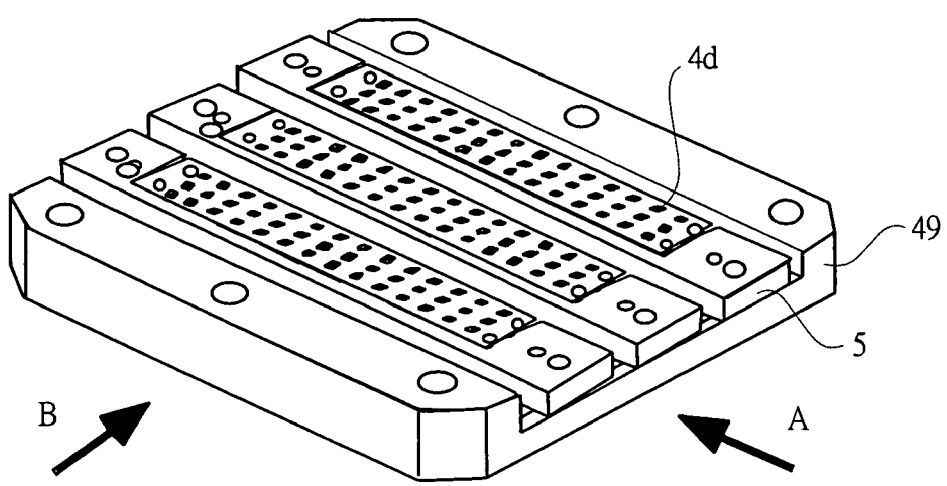
FIG. 3B is a perspective view shown by assembling the main portion of the probe card according to the first embodiment of the present invention as shown in FIG. 2.
Figure 4A:
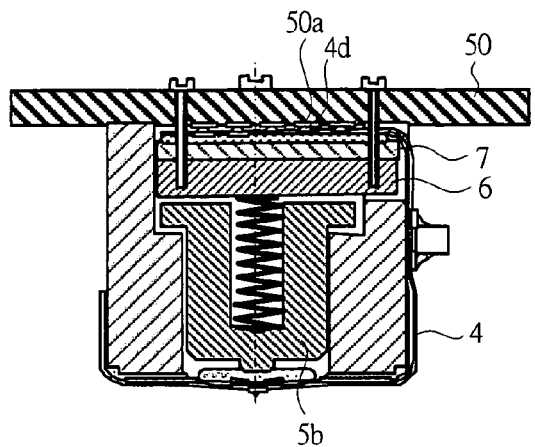
FIG. 4A is a cross-sectional view that shows a main portion of another example in which a pressing method of the probe card or a leading method of the probe sheet according to the present invention is different.
Figure 4B:
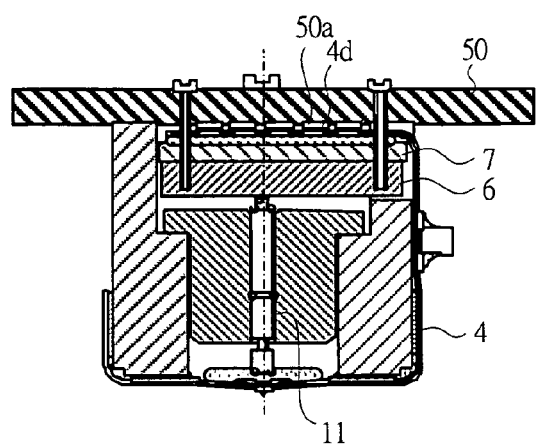
FIG. 4B is a cross-sectional view that shows a main portion of another example in which a pressing method of the probe card or a leading method of the probe sheet according to the present invention is different.
Figure 4C:
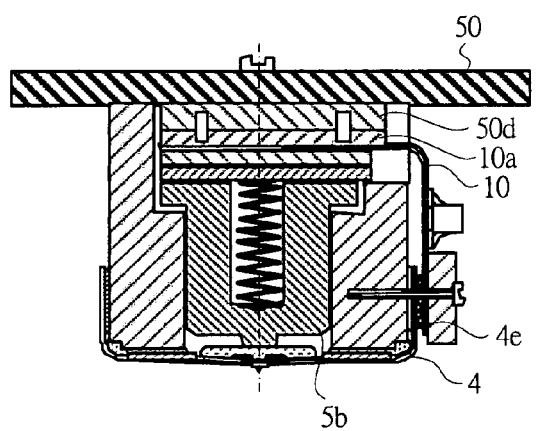
FIG. 4C is a cross-sectional view that shows a main portion of another example in which a pressing method of the probe card or a leading method of the probe sheet according to the present invention is different.
Figure 4D:
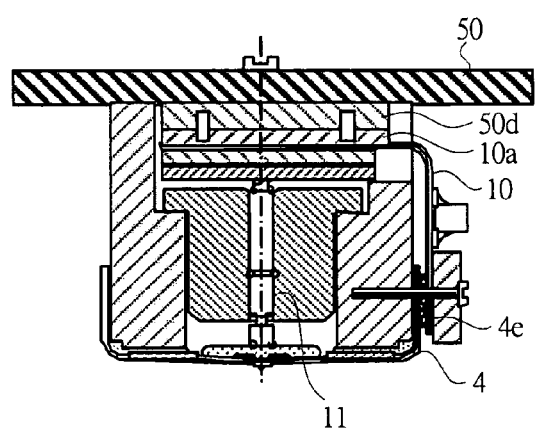
FIG. 4D is a cross-sectional view that shows a main portion of another example in which a pressing method of the probe card or a leading method of the probe sheet according to the present invention is different.
Figure 4E:
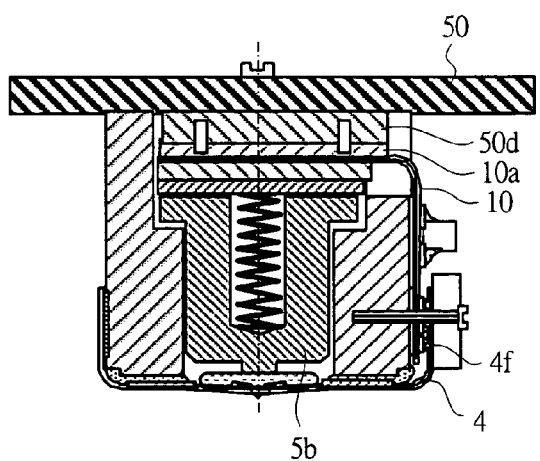
FIG. 4E is a cross-sectional view that shows a main portion of another example in which a pressing method of the probe card or a leading method of the probe sheet according to the present invention is different.
Figure 4F:
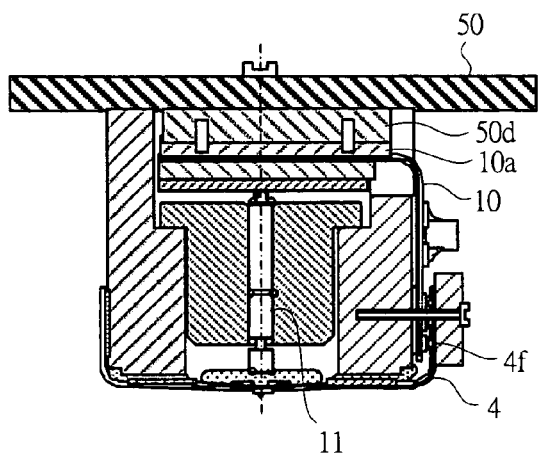
FIG. 4F is a cross-sectional view that shows a main portion of another example in which a pressing method of the probe card or a leading method of the probe sheet according to the present invention is different.
Figure 5A:
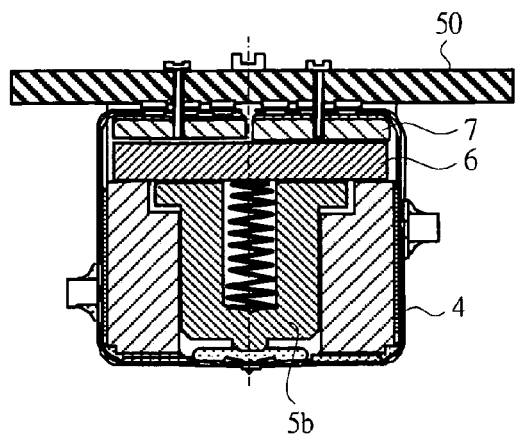
FIG. 5A is a cross-sectional view that shows a main portion of another example in which a pressing method of the probe card or a leading method of the probe sheet according to the present invention is different.
Figure 5B:
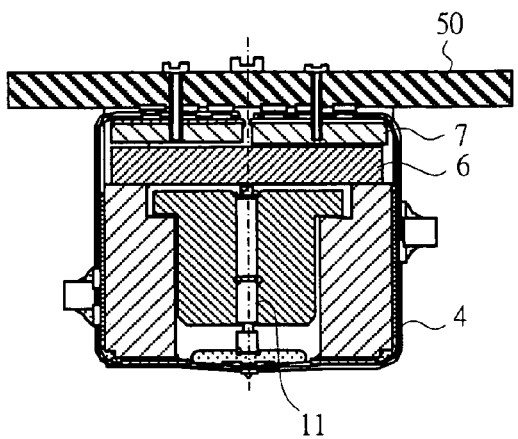
FIG. 5B is a cross-sectional view that shows a main portion of another example in which a pressing method of the probe card or a leading method of the probe sheet according to the present invention is different.
Figure 5C:
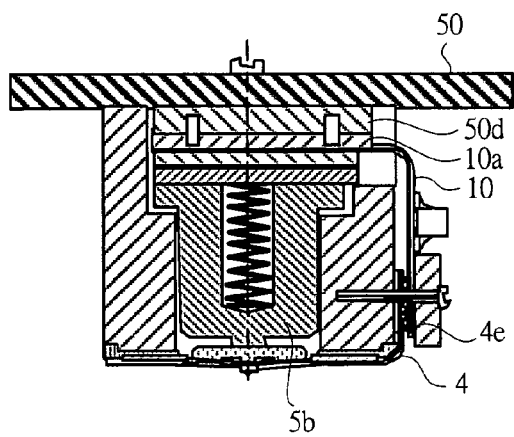
FIG. 5C is a cross-sectional view that shows a main portion of another example in which a pressing method of the probe card or a leading method of the probe sheet according to the present invention is different.
Figure 5D:
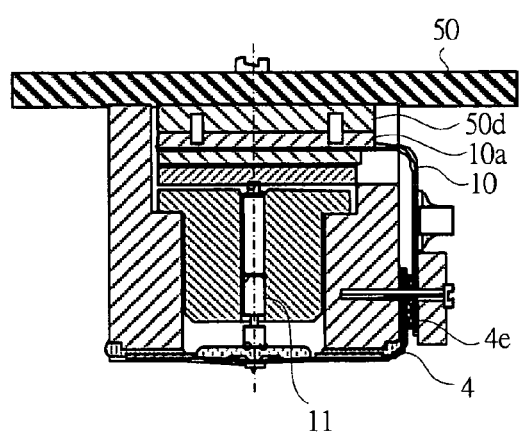
FIG. 5D is a cross-sectional view that shows a main portion of another example in which a pressing method of the probe card or a leading method of the probe sheet according to the present invention is different.
Figure 5E:
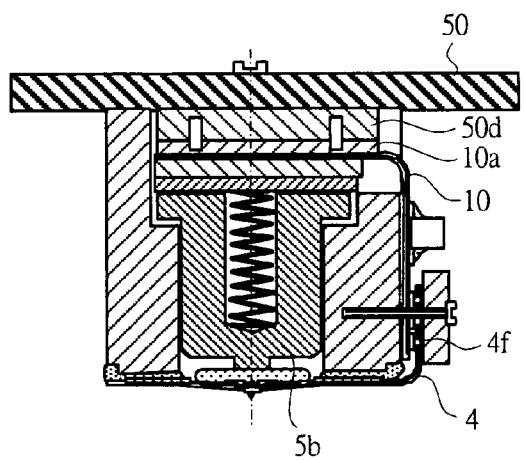
FIG. 5E is a cross-sectional view that shows a main portion of another example in which a pressing method of the probe card or a leading method of the probe sheet according to the present invention is different.
Figure 5F:
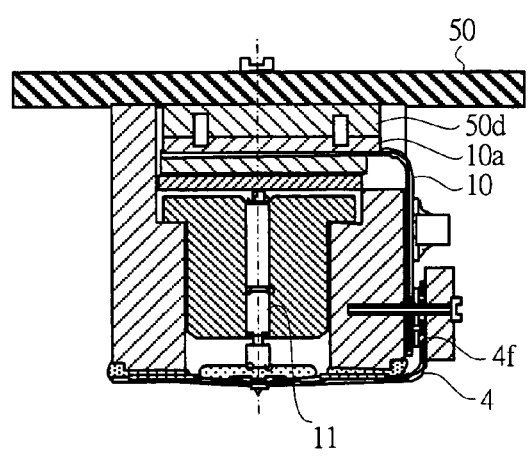
FIG. 5F is a cross-sectional view that shows a main portion of another example in which a pressing method of the probe card or a leading method of the probe sheet according to the present invention is different.

FIG. 3B is a perspective view that shows the adhesion holder 5 to which a probe sheet 4 is fixedly attached is assembled into the adhesion holder fixed plate 49. The adhesion holder 5 having a probe sheet 4 is formed in a rectangle shape along a column direction of the semiconductor element on the wafer 1.

FIG. 2 is a cross-sectional view of the adhesion holder 5 as viewed from an A direction of the FIG. 3 B.

In FIGS. 4, 5, 20 and 21, a transverse section of a portion of the adhesion holder in which a pressing method or a leading method of the probe sheet is different. The differences in the arrangements of the probe sheet will be described in the following (1) to (4).

(1) In the arrangements shown in FIGS. 4A, 4C, 4E, 5A, 5C, 5E, 20A, 20C, 21A, and 21C, the region of the probe sheet 4 where the contact electrodes are formed is pressed by the press block 5*b* having a spring. In the arrangements shown in the FIGS. 4B, 4D, 4F, 5B, 5D, 5F, 20B, 20D, 21B, and 21D, the region of the probe sheet 4 where the contact electrodes are formed is pressed by the spring probe 11.

(2) In the arrangements shown in FIGS. 5A, 5B, 21A, 21B, 21C, and 21D, the probe sheet is extracted along both sides of the adhesion holder. In the arrangements shown in other figures, the probe sheet is extracted along one side of the adhesion holder.

(3) In the arrangements shown in FIGS. 4A, 4B, 5A, 5B, 21C, and 21D, the electrode 4*d* of the probe sheet 4 is connected to the electrode 50*a* of the multilayered wiring substrate 50. In the arrangements shown in FIGS. 20A, 20B, 20C, 20D, 21A, and 21B, a connector 4*g* connected to one end of the probe sheet 4 is connected to the connector 50*d* of the multilayered wiring substrate 50. In the arrangement shown in other figures, a connector 10*a* connected to one end of the wiring sheet 10 connected to the probe sheet 4 is connected to the connector 50*d* of the multilayered wiring substrate 50.

(4) In the FIGS. 4C, 4D, 5C, and 5D, the electrode of the probe sheet 4 to be connected to the wiring sheet 10 having a connector 10*a* is a truncated-pyramid-shaped protrusion 4*e*. In the FIGS. 4E, 4F, 5E, and 5F, the electrode is a plating bump 4*f*.

The above arrangement can be used in any combination.

In one method described in above (1), the probe sheet 4 of region where the contact terminals are formed is pressed by the press block 5*b* having a spring. Particularly, this method is carried out as follows: a probes sheet adhesion holder has a probe sheet 4 having a contact terminal 4*a* that contacts with an electrode 3 provided on the wafer 1, the leading wiring 4*c* led from the contact terminal 4*a*, and the electrode 4*d* that is electrically connected to the wiring 4*c* ; and a multilayered wiring substrate 50 having an electrode 50*a* that is electrically connected to the electrode 4*d* of the probe sheet 4. The contact between the contact terminal 4*a* of the probe sheet 4 and the electrode 3 provided on the wafer 1 is established by a probe sheet adhesion holder for pressing, from backside a terminal group of the contact terminals 4*a*, the group via a press block 5*b* with a built-in a spring to contact with the electrode 3.

In alternative method described in (1), the region of a probe sheet 4 where the contact terminals are pressed by a spring probe 11. The method is carried out as follows: the probe sheet adhesion holder has a probe sheet 4 having a contact terminal 4*a* that contacts an electrode 3 provided on a wafer 1, a wiring 4*c* led from the contact terminal 4*a*, and an electrode 4*d* that is electrically connected to the wiring 4*c*; and a multilayered wiring substrate 50 having an electrode 50*a* that is electrically connected to the electrode 4*d* of the probe sheet 4. The contact between the contact terminal 4*a* of the probe sheet 4 and the electrode 3 provided on the wafer 1 is established by the probe sheet adhesion holder for pressing, from backside of a terminal group of the contact terminals 4*a*, the group via a built-in spring probe 11.

In alternative method described in (3), a connector 4*g* connected to one end of the probe sheet 4 is connected to the connector 50*d* of the multilayered substrate 50. The method is carried out as follows: the probe sheet adhesion holder has a probe sheet 4 having a contact terminal 4*a* that contacts with an electrode 3 provided on a wafer 1, wiring 4*c* from the contact terminal 4*a*, and a connector 4*g* that is electrically connected to the leading wiring 4*c*, and a multilayered wiring substrate 50 having a connector 50*d* that is electrically connected to the connector 4*g* of the probe sheet 4. The contact between the contact terminal 4*a* of the probe sheet 4 and the electrode 3 provided on the wafer 1 is established by the probe sheet adhesion holder for pressing, from the backside the contact terminals 4*a* from the backside thereof via a press block 5*b* incorporating a spring. Alternatively, the contact between the contact terminal 4*a* of the probe sheet 4 and the electrode 3 mounted on the wafer 1 is established by a probe sheet adhesion holder that presses the contact terminals 4*a* from backside thereof via an incorporated spring probe 11.

In an alternative method described in (3), a connector 10*a* connected to one end of the wiring sheet 10 connected to the probe sheet 4 is connected to the connector 50*d* of the multilayered wiring substrate 50. This method is carried out as follows: the probe sheet adhesion holder has a probe sheet 4 having a contact terminal 4*a* that contacts an electrode 3 provided on a wafer 1, and the leading wiring 4*c* from the contact terminal 4*a*; a wiring sheet 10 that has wiring electrically connected to the wiring 4*c* of the probe sheet 4, and a connector 10*a* electrically connected to the wiring; and a multilayered wiring substrate 50 having a connector 50*d* that is electrically connected to the connector 10*a* of the wiring sheet 10. The contact between the contact terminal 4*a* of the probe sheet 4 and the electrode 3 mounted on the wafer 1 is established by a probe sheet adhesion holder that presses the contact terminals 4*a* from backside thereof via a press block 5*b* incorporating a spring. Alternatively, the contact between the contact terminal 4*a* of probe sheet and electrode 3 mounted on the wafer 1 is established by a probe sheet adhesion holder that presses the contact terminals 4*a* from backside thereof via an incorporated spring probe 11.

In the exemplary structures as above, the probe sheet is extracted along the side of the adhesion holder. However, as shown in FIGS. 22A, 22B, 22C, 22D, 22E, and 22F, the probe sheet 4 adhered to bottom of the adhesion holder can be connected by slanting or bending the multilayered wiring substrate 50.

For a contact terminal 4*a* on the probe sheet 4, a pyramid-shaped or truncated-pyramid-shaped contact terminal that is formed using a hole by anisotropic etching of the crystalline member can be used. Thus, stable contact resistance (about $0.05\Omega$ to $0.1\Omega$) can be ensured with small needle pressure (contact pressure between the electrode is 3 to 50 mN per pin), damage to the chip can be prevented, and impression to the semiconductor element during a test can be minimized. The detailed manufacturing method of the contact terminal 4*a* and the probe sheet 4 will be described later.

Next, the manufacturing method of an exemplary probe sheet used in a probe card according to the first embodiment of the invention will be described with reference to FIGS. 6 and 7.

FIG. 6 shows a manufacturing process to form a probe card shown in FIG. 2. Particularly, the FIG. 6 shows a manufacturing process wherein a truncated pyramid-shaped contact terminal and an electrode for connection is formed together with the wiring, using a truncated pyramid-shaped hole formed by anisotropic etching of the silicon wafer 80 as a shape, a metal film is bonded to a polyimide sheet, and a thin film probe sheet supported by a metal film is formed by patterning the metal film.

First, the process shown in FIG. 6A is performed. In this process, a silicon dioxide film 81 having about 0.5 μm thickness is formed by thermal oxidation on both sides of the silicon wafer 80 (100) having thickness of 0.2 mm to 0.6 mm. Then, a photo resist is applied, pattern is formed by a photo-lithography process, and the silicon dioxide film 81 is etched off with mixture of fluorinated acid and ammonium fluoride, using the photo resist as a mask. Using the silicon dioxide film 81 as a mask, anisotropic etching is performed on the silicon wafer 80 with strong alkali solution (e.g. potassium hydrate) to form a truncated-pyramid shaped etching hole 80*a* surrounded by side walls of (111) surface and flat tip portion of (100) surface.

In this embodiment, the silicon wafer 80 is used as a cast. But any material can be used as a cast provided that it is crystalline. Also in this embodiment, the hole has a truncated-pyramid shape formed by anisotropic etching, but pyramid shape also can be used. Any shape can be used provided that it can form a contact terminal 4*a* having stable contact resistance with small needle pressure.

Next, the process shown in FIG. 6B is performed. In this process, the silicon dioxide film 81 used as a mask is removed by etching with mixture of fluorinated acid and ammonium fluoride, thermal oxidation in wet oxygen atmosphere is performed all surface of the silicon wafer 80, to form a silicon oxide film 82 having thickness of 0.5 μm. Next, a process is performed wherein a photo resist mask 84 is formed on the surface of the conductive film 83 formed on the silicon dioxide film 82, to open the contact terminal section 8.

The conductive film 83 may be formed by forming a chromium film having thickness of about 0.1 μm by sputtering or evaporation using chromium, then forming a copper film having thickness of 1 μm by sputtering or evaporation using copper on the chromium film.

Next, the process shown in FIG. 6C is performed. In this process, electrical coating is performed using the photo resist mask 84 as a mask and the conductive film 83 as a feeding layer, to form the contact terminal 4*a* and connection electrode 4*b* in an integrated manner, then the photo resist mask 84 is removed. As coating material, nickel 8*a*, rhodium 8*b*, and nickel 8*c* is coated one by one in this order, then the contact terminal 8 integrating the contact terminal 4*a* and the connection electrode 4*b* is formed.

Next, the process shown in FIG. 6D is performed. In this process, a polyimide film 85 is formed to cover the contact terminal 8 and the conductive film 83, the part of the polyimide film 85 where the wiring connection hole from the contact terminal 8 is to be formed is removed through the surface of the contact terminal 8, a conductive film 86 is formed on the polyimide film 85, a photo resist mask 87 is formed, and the wiring material 88 is coated.

To remove the part of the polyimide film 85, laser drilling, or a dry etching using an aluminum mask formed on the surface of the polyimide can be used, for example.

The conductive film 86 may be formed by forming a chromium film having thickness of about 0.1 μm by sputtering or evaporation using chromium, then forming a copper film having thickness of about 1 μm by sputtering or evaporation using copper on the chromium film. For the wiring material 88, copper coat or nickel coated copper coat can be used.

Next, the process shown in FIG. 6E is performed. In this process, the photo resist mask 87 is removed, the conductive film 86 is removed by soft etching using the wiring material 88 as a mask, an adhesion layer 89 and a metal film 90 is formed, and a photo resist mask 91 used in the patterning of the metal film 90 is formed.

For the adhesion layer 89, a polyimide adhesion sheet, an epoxy adhesion sheet, or epoxy adhesive can be used for example. For the metal film 90, a metal sheet having low linear expansion coefficient (about linear expansion coefficient 1 to 6 ppm/° C.) close to that of the silicon wafer (silicon shape) 80, such as 42 alloy (an alloy comprising nickel (42%) and iron (58%) with linear expansion coefficient about 4 ppm/° C.) or invar (an alloy comprising nickel (36%) and iron (64%) with linear expansion coefficient about 1.5 ppm/° C.) can be adhered by the adhesion layer 89 to a polyimide film 85 on which the wiring material 88 is formed. This structure improves the strength and increase the area of the probe sheet. Also, it provides accurate alignment under various circumstances. For example it can prevent misalignment due to high temperature during a test. In order to achieve this objective, a material having linear expansion coefficient close to that of the semiconductor element to be tested can be used as the metal film 90 in order to ensure accurate alignment during the burn-in test.

The adhesion can be performed as follows: the wiring material 88 is coated to the polyimide film 85 on which the contact terminal 8 and the wiring material 88 are formed as shown in FIG. 6D, the silicon wafer 80 from which the photo resist mask 87 and the conductive film 86 was removed is put onto the adhesion layer 89 and a metal film 90, raise the temperature higher than glass transition temperature (Tg) of the adhesion layer 89 under 1 to 20 MPa pressure, to adhere the layers at high temperature under pressure in vacuum. The adhesion layer 89 can be formed by applying an epoxy adhesive for example.

Next, the process shown in FIG. 6F is performed. First, the metal film 90 is etched using a photo resist mask 91 formed on the metal film 90. When a 42 alloy film or an invar sheet is used as the metal film 90, spray etching (shower etching) with ferric chloride solution can be used. For the photo resist mask 91, liquid resist or film resist (dry film) is applicable. Next, the photo resist mask 91 is removed, the process ring 95 is fixed to the metal film 90 with the adhesive 96, and a protective film is applied to the surface of the process ring 95. A protective film having a hole in its center is applied to the surface of the silicon wafer 80 where the silicon dioxide film 81 is formed, the silicon dioxide film 81 is etched off with mixture of fluorinated acid and ammonium fluoride using the protective film as a mask, the protective film is peeled off, a protective jig for silicon etching 100 is attached, and the silicon wafer 80 is etched off.

As a preventive jig for silicon etching 100, a fixing jig 100a is mounted to a stainless lid 100b via an O-ring 100c, and the silicon wafer 80 is etched off with strong alkali solution (e.g. potassium hydrate).

Next, the process shown in FIG. 6G is performed. In this process, the protective jig for silicon etching 100 is removed, a protective film is applied to the surface of the process ring 95, and silicon dioxide film 82, chromium film and copper film of the conductive film 83, and electric coated nickel film are etched off to form the probe sheet structure 105.

The silicon dioxide film 82 is etched off with the mixture of fluorinated acid and ammonium fluoride, the chromium film is etched off with potassium permanganate, and the copper film and nickel film is etched off with alkaline copper etching solution.

As the result of a series of etching, rhodium is exposed on the surface of contact terminal. Rhodium is used because aluminum or solder as the material of the electrode 3 hardly adheres to rhodium, and rhodium has higher hardness than nickel, is hardly oxidized, and has stable contact resistance.

Figure 7A:
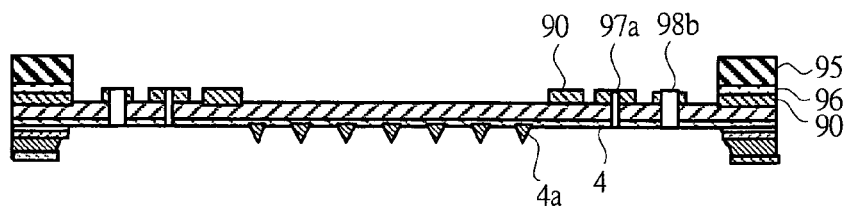
FIG. 7A is a drawing that shows a manufacturing process subsequent to those shown in FIGS. 6A to 6G.

Next, the process shown in FIG. 7A is performed. In the cross-sectional views of FIGS. 7A to 7C, the adhesion holder 5 is viewed from the B direction in FIG. 3B. In this process, a knock pin holes 97a and 98b are formed in the probe sheet 4 on which the process ring 95 is fixed. The hole on the probe sheet 4 can be formed by laser drilling, dry etching, or punching.

Figure 7B:
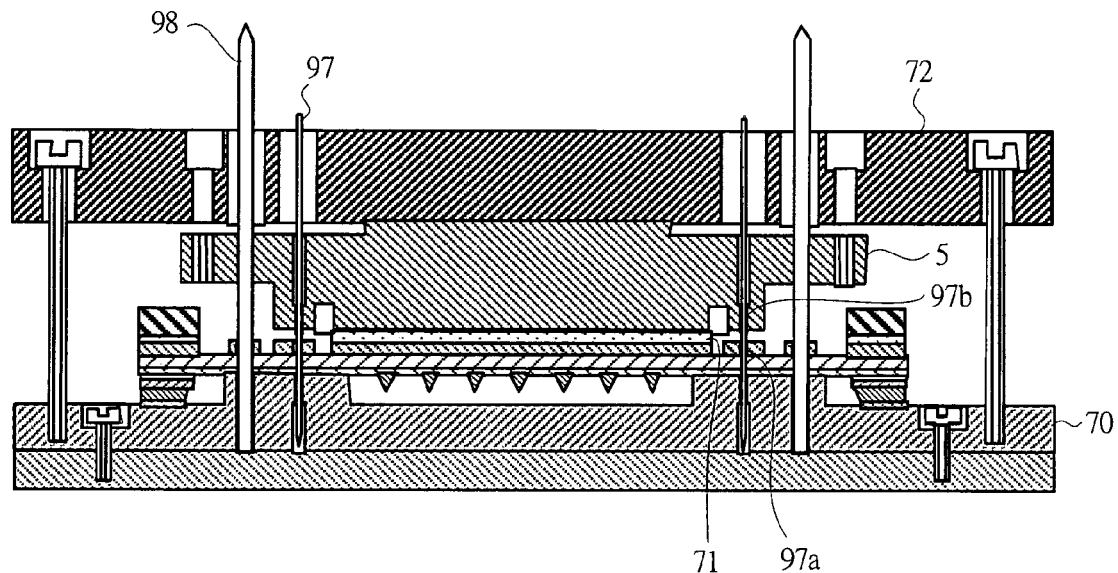
FIG. 7B is a drawing that shows a manufacturing process subsequent to FIG. 7A.

Next, the process shown in FIG. 7B is performed. In the process, the adhesion holder 5 on which the adhesive 71 is applied is aligned to the probe sheet 4, by the knock pin hole 97b on the adhesion holder 5 and the knock pin hole 97a on the probe sheet 4 using a knock pin 97. The probe sheet 5 maintained in a proper position using the knock pin 98 is mounted on the contact terminal protective stage 70. The adhesion holder 5 is pressed and fixed to the probe sheet 4 by an adhesion holder holding plate 72.

Next, the process shown in FIG. 7 C is performed. In this process, the adhesion holder holding plate 72 is removed, the knock pins 97 and 98 are removed, and the probe sheet 4 on which the adhesion holder 5 is fixed is cut out in a desired shape. To cut out the probe sheet 4, laser cut, die cut, or knife cut can be used. The cutout shape of the probe sheet 4 is suitable for the structure of the probe sheet shown in the FIGS. 4, 5, 20, 21, and 22. For example, as shown in the example of FIG. 3, an adhesion holder is assembled to a probe card illustrated in the FIG. 2.

Figure 8:
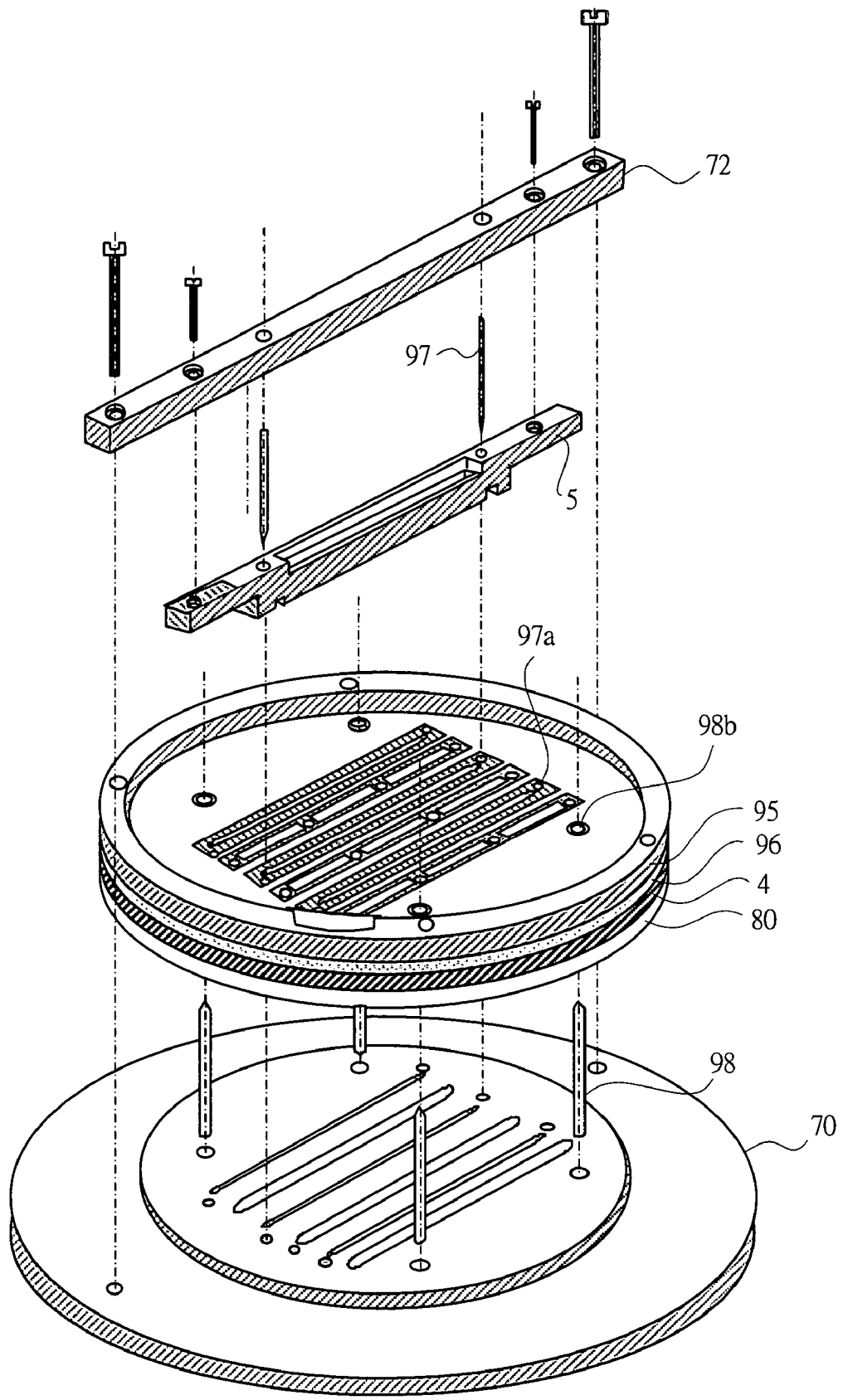
FIG. 8 is a perspective view that shows an example of an assembly jig used to adhere a adhesion holder to a probe sheet in the manufacturing process of the probe sheet (structure) in the prove card according to the present invention.

FIG. 8 is a perspective view that shows an example of an assembly jig used to attach the adhesion holder 5 to the probe sheet 4. The assembly process described with reference to FIG. 7B can be performed using this assembly jig.

Next, a manufacturing process of a probe sheet according to the second embodiment will be described with reference to FIG. 9. This process is different a little from that of the probe sheet according to the first embodiment.

FIGS. 9A to 9D show another manufacturing process to form a probe sheet step-by-step.

Figure 9A:
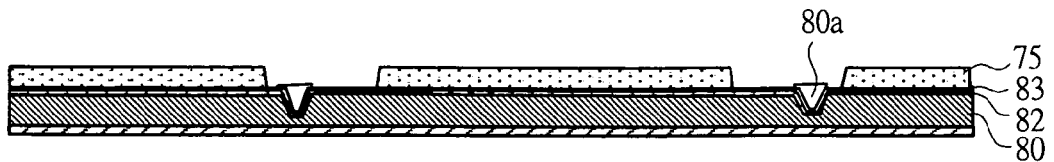
FIG. 9A is a drawing that shows another manufacturing process of forming a probe sheet in step order in the probe card according to the present invention.

As described, a truncated pyramid shaped etching hole 80a is formed in a silicon wafer 80 shown in FIG. 6A. Next, the silicon dioxide film used as a mask is etched off with the mixture of fluorinated acid and ammonium fluoride, the whole surface of the silicon wafer 80 is thermally oxidized in wet oxygen atmosphere to form silicon dioxide film 82 having about 0.5 μm thickness. Subsequently, the process shown in FIG. 9A is performed. In this process, a conductive film 83 is formed on the surface of the silicon dioxide film 82, a polyimide film 75 is formed on the surface of the conductive film 83, and a portion of the polyimide film 75 on which the contact terminal 4a is to be formed is removed through the conductive film 83.

As a conductive film 83, a chromium film having about 0.1 μm thickness is formed by sputtering or deposition using chromium, then a copper film having about 1 μm thickness is formed by sputtering or deposition using copper on the surface on which the chromium film is formed. In order to remove the polyimide film 75, laser drilling, or dry etching with aluminum mask formed on the surface of the polyimide film 75 can be used.

Figure 9B:
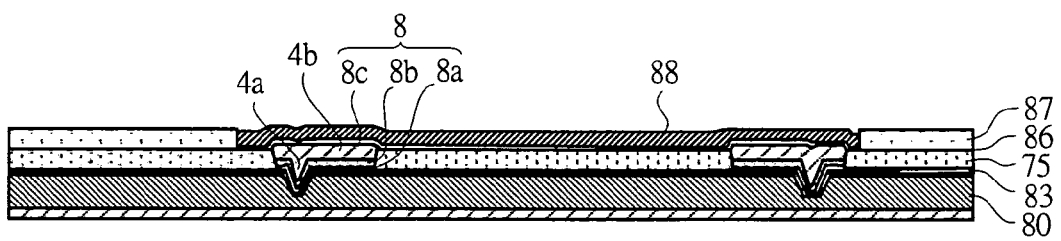
FIG. 9B is a drawing that shows another manufacturing process of forming a probe sheet in step order in the probe card according to the present invention.

Next, the process shown in FIG. 9B is performed. First, hard material is electrically coated to the conductive film 83 exposed at the aperture of the polyimide film 75 using the conductive film 83 as an electrode, to form a contact terminal 4a and a contact electrode 4b in an integrated manner. Next, a conductive film 86 is formed on the contact terminal 8 and the polyimide film 75, a photo resist mask 87 is formed, and wiring material 88 is formed.

As a hard material for coating, nickel 8a, rhodium 8b, nickel 8c can be coated in this order, to form a contact terminal 8 integrating the contact terminal 4a and the contact electrode 4b.

For a conductive film 86, a chromium film having about 0.1 μm thickness can be formed by sputtering or evaporation using chromium, and a copper film having about 1 μm thickness can be formed by sputtering or evaporation using copper on the surface of the chromium film. For the wiring material 88, copper or nickel coated copper can be used.

Figure 9C:
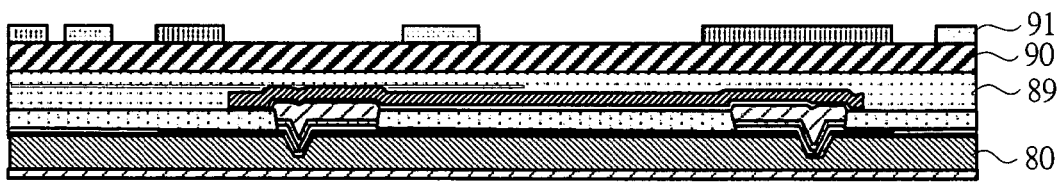
FIG. 9C is a drawing that shows another manufacturing process of forming a probe sheet in step order in the probe card according to the present invention.

Next, the process shown in FIG. 9C is performed. In this process, the photo resist mask 87 is removed, the conductive film 86 is removed by soft etching using the wiring material 88 as a mask, the adhesion layer 89 and the metal film 90 are formed, and a photo resist mask 91 is formed on the metal film 90.

For the adhesion layer 89, a polyimide adhesion sheet or an epoxy adhesion sheet can be used for example. For the metal film 90, a metal sheet having low linear expansion coefficient close to that of the silicon wafer (silicon shape) 80 such as 42 alloy (an alloy comprising nickel (42%) and iron (58%) with linear expansion coefficient about 4 ppm/° C.) or invar (an alloy comprising nickel (36%) and iron (64%) with linear expansion coefficient about 1.5 ppm/° C.) can be adhered by the adhesion layer 89 to the polyimide film 75 on which the wiring material 88 is formed. This structure improves the strength and increase the area of the probe sheet. Also, it provides accurate alignment under various circumstances. For example it can prevent misalignment due to high temperature during a test. In order to achieve this objective, a material having linear expansion coefficient close to that of the semiconductor element to be tested can be used as the metal film 90 in order to ensure accurate alignment during a burn-in test.

Figure 9D:
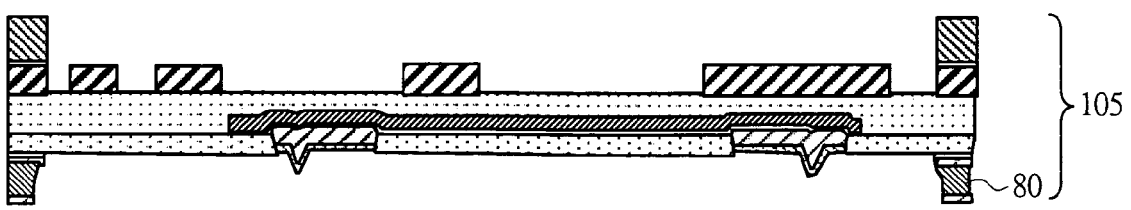
FIG. 9D is a drawing that shows another manufacturing process of forming a probe sheet in step order in the probe card according to the present invention.

The adhesion can be performed as follows: the wiring material 88 is coated to the polyimide film 75 on which the contact terminal 8 and the wiring material 88 are formed as shown in FIG. 9D, the silicon wafer 80 from which the photo resist mask 87 and the conductive film 86 were removed is put onto the adhesion layer 89 and a metal film 90, raise the temperature higher than glass transition temperature (Tg) of the adhesion layer 89 under 1 to 20 MPa pressure, to adhere the layers at high temperature under pressure in vacuum. The adhesion layer 89 can be formed by applying epoxy adhesive for example.

Next, the process shown in FIG. 9D is performed. In this process, a probe sheet structure 105 is manufactured using the process shown in FIG. 6F.

Figure 7C:
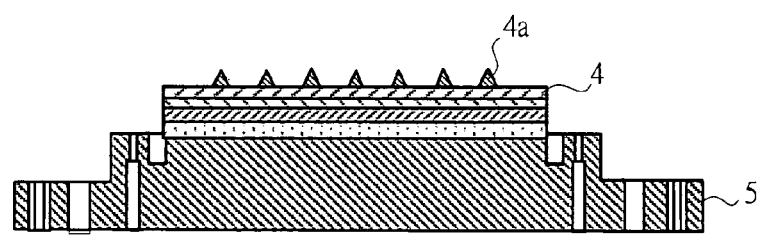
FIG. 7C is a drawing that shows a manufacturing process subsequent to FIG. 7B.

Using this probe sheet structure 105, the adhesion holder 5 is adhered as shown in FIGS. 7A to 7C, to form a probe card as shown in FIG. 2.

Next, a manufacturing process of a probe sheet according to the third embodiment will be described with reference to FIG. 10.

The manufacturing method of the probe sheet is similar to that described with reference to the FIG. 9, except that, in this method, a coated bump 77 for external connection is formed on the wiring material 88 of the wiring from the contact terminal 4a. The coated bump 77 is used as an electrode (bump) 4f to connect to the electrode of the wiring sheet 10 to connect to the electrode of the multilayered wiring substrate 50, as shown in the FIGS. 4E, 4F, 5E and 5F.

An exemplary manufacturing method of the bump 77 will be described with reference to the FIG. 10.

Figure 10A:
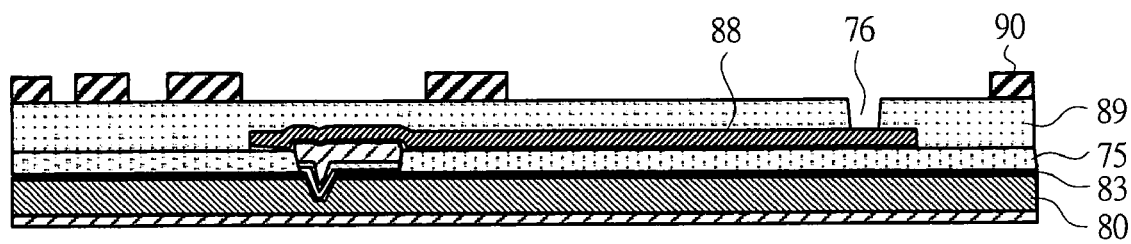
FIG. 10A is a drawing that shows another manufacturing process of forming a probe sheet in step order in the probe card according to the present invention.

The FIG. 10A shows a process to form a hole 76. First, a process to form a contact terminal 4a is performed in a manner similar to the process shown in FIGS. 9A to 9C, then, the contact layer 89 of a portion on which the coated bump 77 is to be formed is removed through the surface of the wiring material 88, and a hole 76 is formed.

In order to remove the adhesion layer 89, laser drilling, or dry etching using an aluminum mask on the surface of the adhesion layer 89 can be used.

Figure 10B:
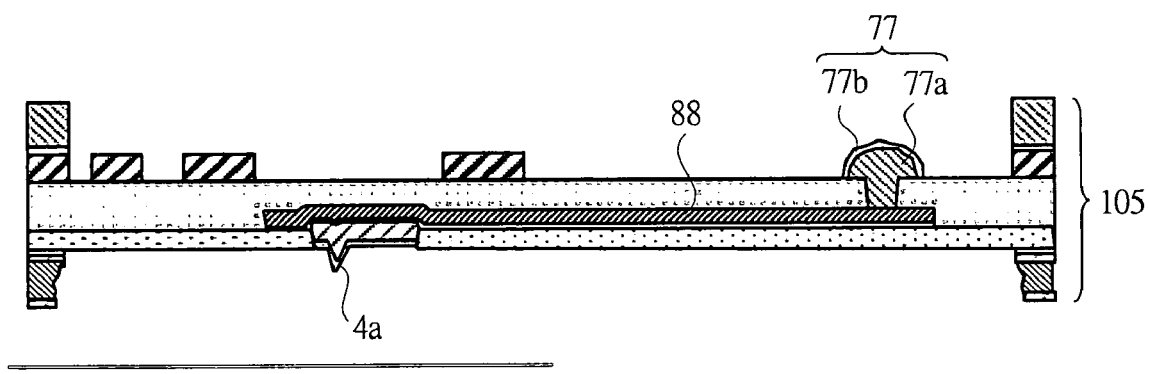
FIG. 10B is a drawing that shows another manufacturing process of forming a probe sheet in step order in the probe card according to the present invention.

Next, the process shown in FIG. 10B is performed. In this process, electrical coating is performed on the wiring material 88 exposed at the hole 76 of the adhesion layer 89 using the conductive film 83 as an electrode to form coated bump 77a, then a coated layer 77b is formed on the surface of the coated bump 77a. Then, a process similar to that shown in FIG. 6F is performed, to manufacture a probe sheet structure 105.

For coating material, copper or nickel can be coated as a coated bump 77a, and gold can be coated as a coated layer 77b.

Using this probe sheet structure 105, the adhesion holder 5 is adhered as shown in FIGS. 7A to 7C, to form a probe card.

The manufacturing process of the probe sheet according to the fourth embodiment will be described with reference to FIG. 11. In this exemplary process, a selective coated film is used for forming a probe sheet.

Figure 11A:
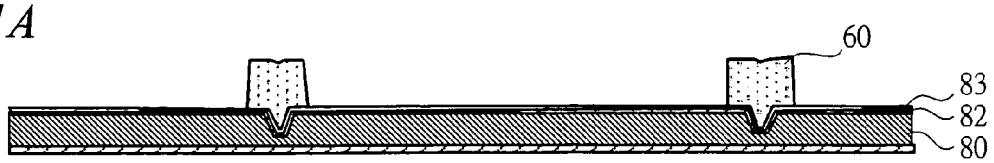
FIG. 11A is a drawing that shows another manufacturing process of forming a probe sheet in step order in the probe card according to the present invention.

First, the process shown in the FIG. 11A is performed. In this process, a pyramid-shaped etching hole is formed in the silicon wafer 80 by a process similar to that show in FIGS. 6A and 6B, a silicon dioxide film 82 and a conductive film 83 are formed on its surface. Next, unlike the FIG. 6B, a pattern of a photo resist 60 is formed on the portion on which the contact terminal 4a is to be formed. Alternatively, a dry film can be used instead of a photo resist.

Figure 11B:
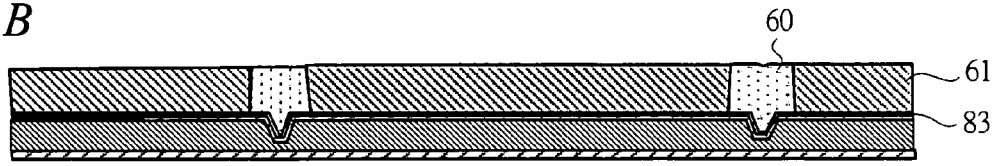
FIG. 11B is a drawing that shows another manufacturing process of forming a probe sheet in step order in the probe card according to the present invention.

Next, the process shown in FIG. 11B is performed. In this process, a selective coated layer 61 is coated using the conductive film 83 as an electrode. As the selective coated layer 61, copper is coated for 1 to 50 μm, for example.

Figure 11C:
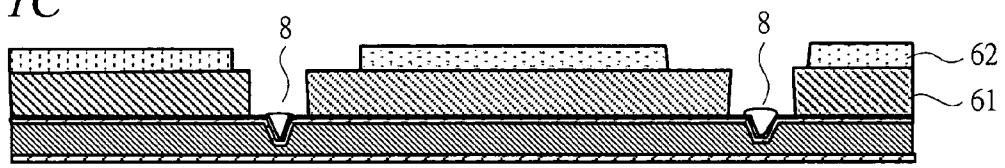
FIG. 11C is a drawing that shows another manufacturing process of forming a probe sheet in step order in the probe card according to the present invention.

Next, the process shown in FIG. 11C is performed. In this process, the photo resist 60 is removed, and a pattern of the dry film 62 is formed on the surface of the selective coated film (copper coated layer) 61.

Figure 11D:
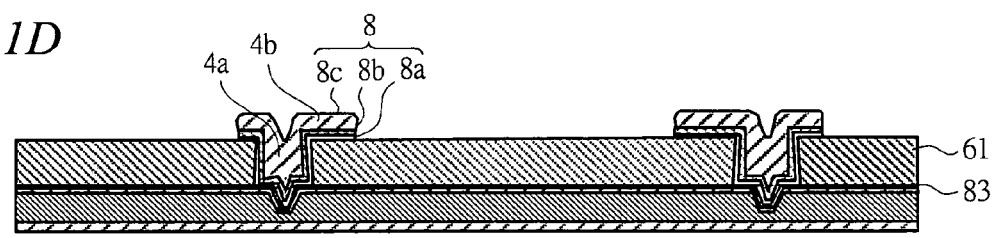
FIG. 11D is a drawing that shows another manufacturing process of forming a probe sheet in step order in the probe card according to the present invention.

Next, the process shown in FIG. 11D is performed. In this process, hard material is electrically coated using the dry film 62 as a mask, and the conductive film 83 and the selective coated film 61 as an electrode, to form the contact terminal 4a and the contact electrode 4b in an integrated manner. As a hard coating material, nickel 8a, rhodium 8b, nickel 8c is coated in this order, to form the contact terminal 8 integrating the contact terminal 4a and the contact electrode 4b. After that, the dry film 62 is removed.

Figure 11E:
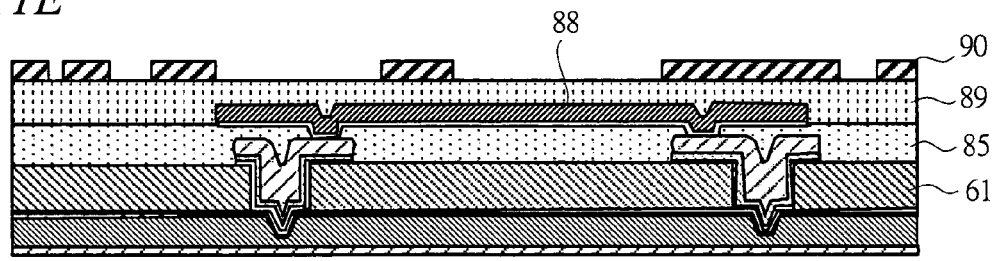
FIG. 11E is a drawing that shows another manufacturing process of forming a probe sheet in step order in the probe card according to the present invention.

Next, wiring 88 and a desirable pattern of the metal film 90 as shown in FIG. 11E is formed according to processes similar to those shown in FIGS. 6D to 6E.

Figure 11F:
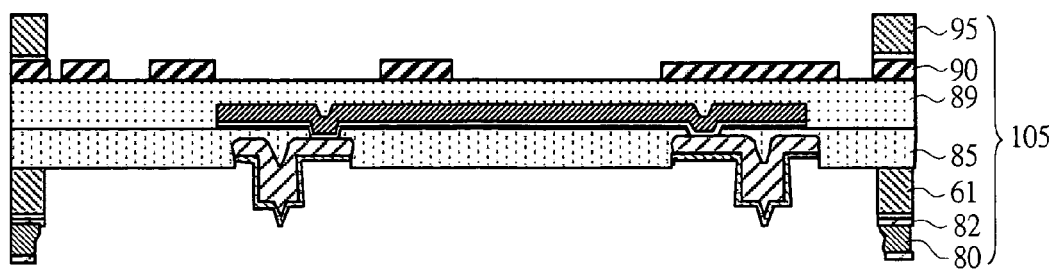
FIG. 11F is a drawing that shows another manufacturing process of forming a probe sheet in step order in the probe card according to the present invention.

Next, a probe sheet structure 105 as shown in FIG. 11F is formed according to processes similar to those shown in FIGS. 6F to 6G. The difference from the process shown in FIG. 6G is that, in this embodiment, a process to remove the selective coated film 61 is additionally performed.

The manufacturing process of the probe sheet according to the fifth embodiment will be described with reference to FIG. 12.

According to the manufacturing process of the probe sheet, a slit is formed between wirings on which the contact terminal is formed using an example wherein a coated film for selective etching is initially formed as shown in FIG. 11. In this configuration, the height of the contact terminal (protrusion from the polyimide film) is ensured with high flexibility. To manufacture a probe sheet before forming a slit, the manufacturing method shown in FIGS. 6 to 10 can also be used.

Figure 12A:
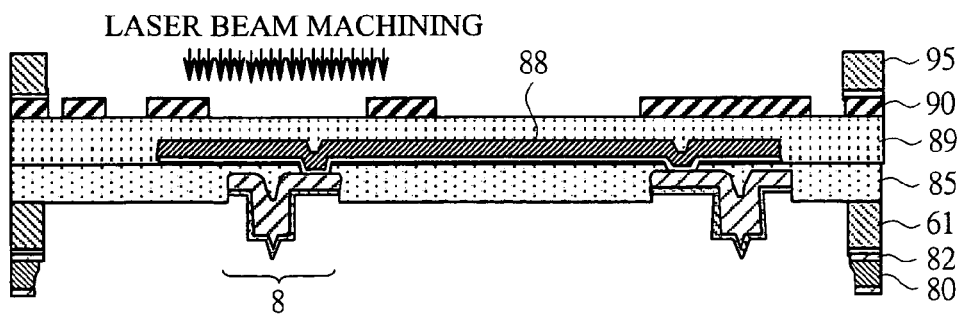
FIG. 12A is a drawing that shows another manufacturing process of forming a probe sheet in step order in the probe card according to the present invention.
Figure 12A:
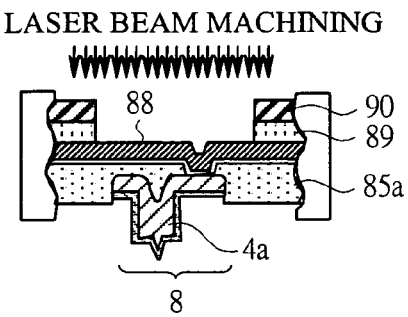
Figure 12A:
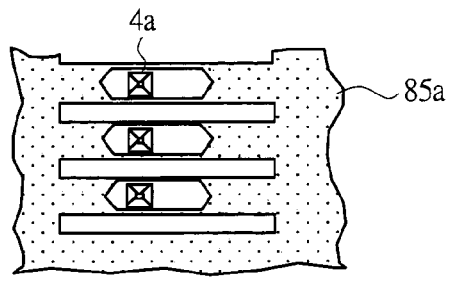
Figure 12A:
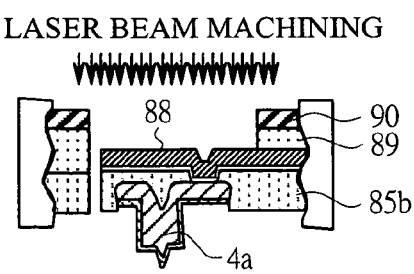
Figure 12A:
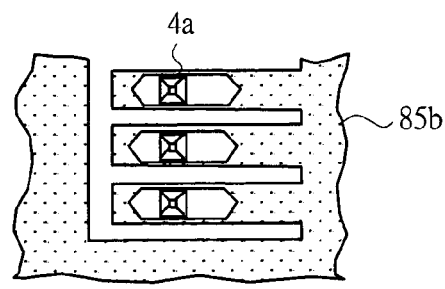

The manufacturing method of the probe sheet structure shown in FIG. 12A uses processes similar to those shown in FIGS. 11A to 11F.

After these processes, as shown in FIG. 12B1, the adhesion layer 89 of the region on which the contact terminal 8 is formed, and the polyimide film 85 of the region that is not covered by the wiring material 88 is removed by a laser, to form a structure in which the contact terminal 4a is supported by double supporting beams of the wiring material 88 and the polyimide 85a. The adhesion layer 89 and the polyimide film 85 can be removed by dry etching.

FIG. 12B2 is a plan view that shows the bottom of a part of the region where the contact terminal 8 of FIG. 12B1 is formed. As shown in the drawing, by separating each side of the contact terminal 8, the polyimide film on which the contact terminal 8 is formed can have copying operation with higher flexibility.

When forming a probe sheet structure as shown in FIG. 12A, the length of the wiring material 88 which is longer than the contact terminal 8 can be reduced. In this configuration, the region of the adhesion layer 89 on which the contact terminals 8 are formed and the region of the polyimide film 85 that is not covered by the wiring material 88 can be removed by a laser, and the contact terminal 4a is supported by a cantilevered beam of the wiring material 88 and the polyimide film 85b. FIG. 12C2 is a plan view that shows the bottom of a part of the region where the contact terminal 8 of FIG. 12C1 is formed. As shown in the drawing, by separating the contact terminals 8, copying operation having higher flexibility can be performed and the mobility will be improved compared to the above described configuration of probe sheet.

Figure 13A:
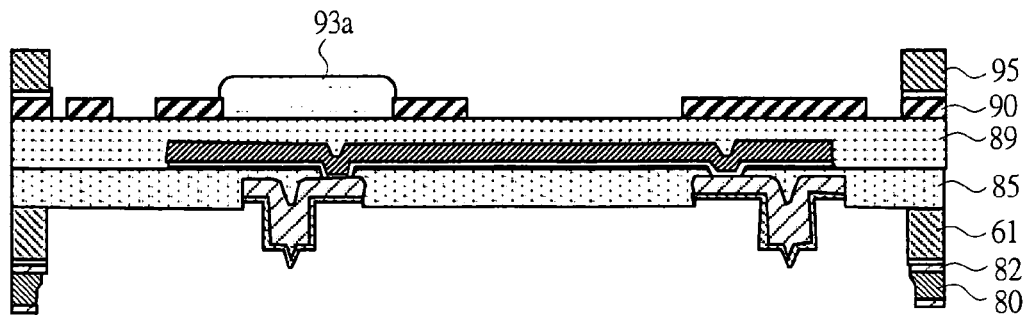
FIG. 13A is a drawing that shows another manufacturing process of forming a probe sheet in step order in the probe card according to the present invention.
Figure 13A:
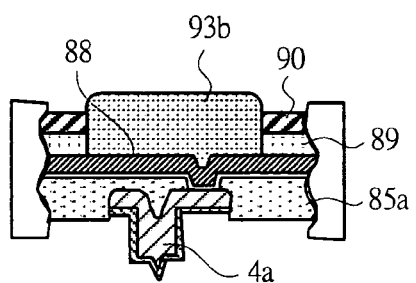
Figure 13A:
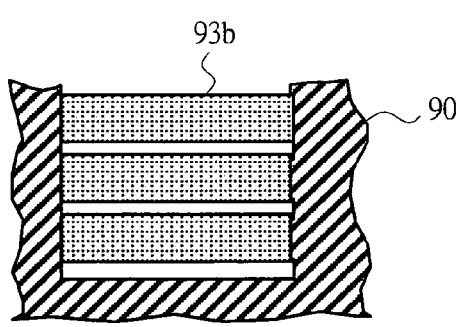

In order to attain stable contact resistance value, an elastomer made from elastic material 93a can be formed to a portion corresponding to the contact terminal, as shown in FIG. 13A.

As an elastomer, elastic material 93a made of elastic resin can be printed or applied by a dispenser, or a silicon sheet or an elastic wire rod can be provided. Alternatively, photo sensitive elastic material (e.g. photosensitive silicon resin) can be applied to form pattern on the portion corresponding to the contact terminal.

Figure 13C:
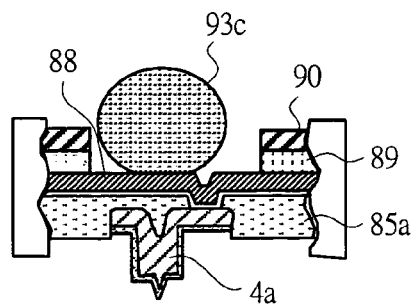
FIG. 13C is a cross-sectional view that shows a part of the region where the contact terminal portion is formed.

The elastmer can be formed on the adhesion layer 89, or on a probe sheet from which the adhesion layer 89 and the polyimide film 85 is partly removed. FIGS. 13B1 and 13C show an example in which the elastic resin 93b is formed into a doubly supporting beam and an example in which an elastic wire rod 93c is provided. FIG. 13B2 is a plan view that shows the bottom of the part of the region where the contact terminal 8 of FIG. 13B1 is formed.

Several options in which an elastomer is formed in the probe sheet structure are described as above. The elastomer can be formed on any probe sheet structure as described above.

The elastomer absorbs the shock as a whole when the tips of a plurality of contact terminals contact the electrodes 3 arrayed on the wafer 1, and makes even contact between the contact terminals of the probe sheet, and the electrode 3. That is, the elastmer locally deforms and dissolves the variation less than several μm in the height of the contact terminals, and the variation about ±0.5 μm in the height of the electrodes 3 arrayed on the wafer 1.

Figure 14:
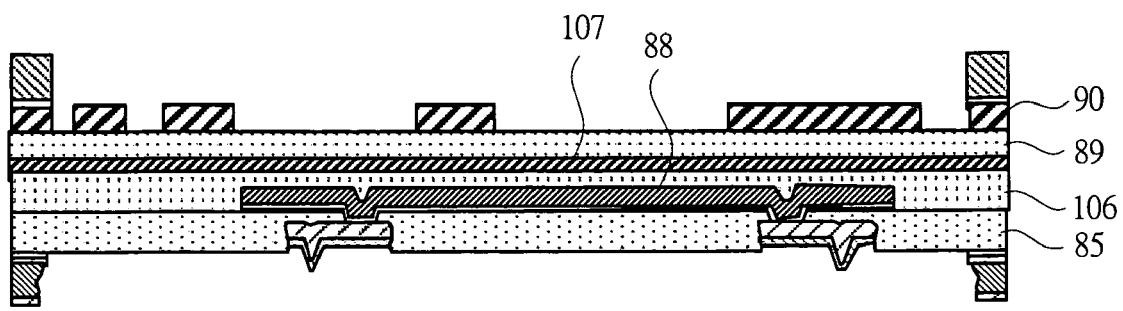
FIG. 14 is a drawing that shows another manufacturing process of forming a probe sheet in step order in the probe card according to the present invention.
Figure 15:
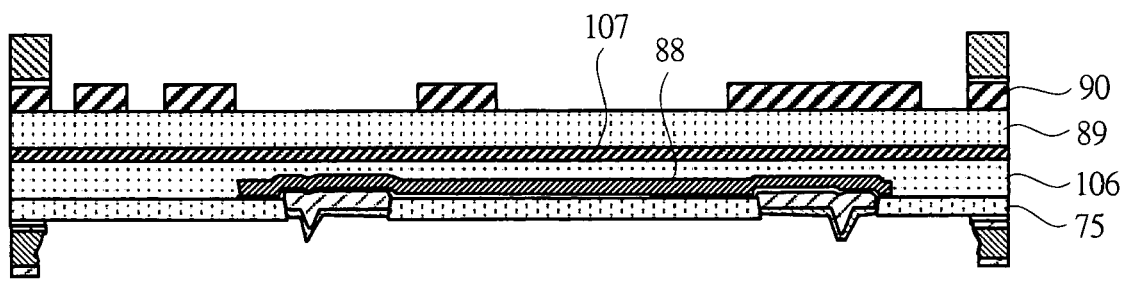
FIG. 15 is a drawing that shows another manufacturing process of forming a probe sheet in step order in the probe card according to the present invention.

In order to minimize disturbance in the electric signal as a probe for high-speed electric signal test, preferably a ground layer is formed on the probe sheet. For example, as shown in FIG. 14 or 15, a polyimide film 106 and a ground layer 107 can be formed on the surface on which the wiring material 88 of the wiring is formed, then, a pattern comprising the contact layer 89 and the metal film 90 as described can be formed.

Alternatively, the metal film 90 can be left as far as possible to use as a ground layer. When 42 alloy or invar is used for the metal film 90, the surface thereof can be coated with gold or copper as necessary, to form more stable ground layer.

Alternatively, a dummy terminal 108 having similar form as the contact terminal 4a can be provided on any position on the probe sheet to prevent excessive load from being locally applied to the contact terminals at the beginning of a test. Next, the structure and manufacturing process of this dummy terminal will be described with reference to FIG. 16.

The manufacturing method of this probe sheet is similar to that described with reference to FIGS. 6 to 15, except that, a dummy terminal 108 having similar form as the contact terminal 4a is added. The dummy terminal 108 prevents deformation of the probe sheet 4 when the electrode 3 of the wafer 1 contacts, and prevents excessive load from being locally applied to the contact terminals at the beginning a test. The form may not be same as that of the contact terminal 4a. As shown in FIG. 16, the dummy terminal 108 may have a truncated pyramid shape having bottom area (area to contact the wafer 1) larger than that of the contact terminal 4a. For a probe sheet manufactured according to other methods, the dummy terminal 108 can be provided as well.

The manufacturing method of the dummy terminal as above will be described with reference to FIG. 16.

Figure 16A:
FIG. 16A is a drawing that shows another manufacturing process of forming a probe sheet in step order in the probe card according to the present invention.

First, the process shown in FIG. 16A is performed. In this process, a silicon dioxide film 81 having about 0.5 μm thickness is formed by thermal oxidation on both sides of the (100) surfaces of the silicon wafer 80 having about 0.2 to 0.6 mm thickness. The silicon dioxide film 81 is etched off by a mixture of fluorinated acid and ammonium fluoride, using a photo resist mask. Anisotropic etching is performed on the silicon wafer 80 by strong alkaline solution (e.g. potassium hydrate) using the silicon dioxide film 81 a part of which is etched off as a mask, to form etching holes 80a and 80b having a pyramid-shape or a truncated pyramid-shape.

Figure 16B:
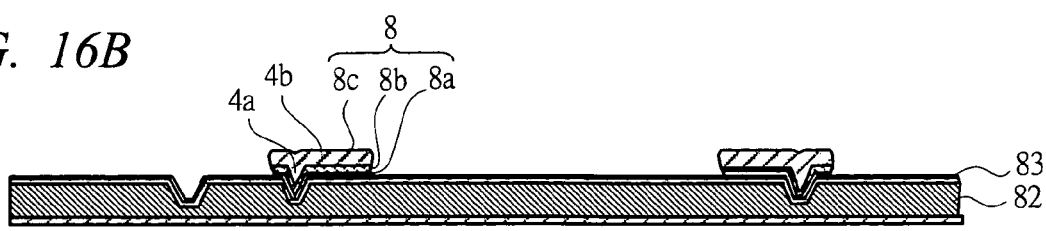
FIG. 16B is a drawing that shows another manufacturing process of forming a probe sheet in step order in the probe card according to the present invention.
Figure 16C:
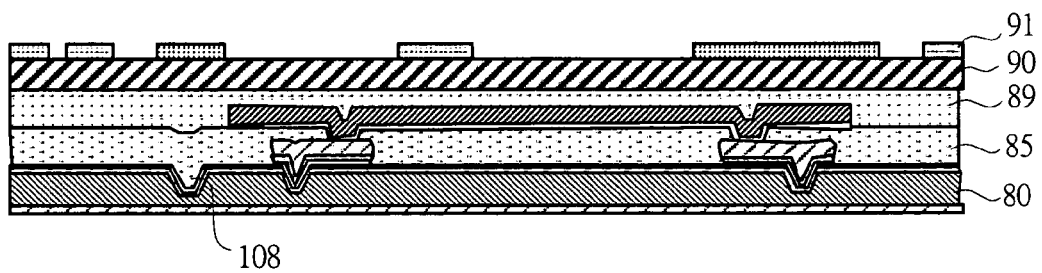
FIG. 16C is a drawing that shows another manufacturing process of forming a probe sheet in step order in the probe card according to the present invention.

Next, the process shown in FIG. 16B is performed. In this process, the silicon dioxide film 81 used as a mask is etched off by the mixture of fluorinated acid and ammonium fluoride, a silicon dioxide film 82 having about 0.5 μm thickness is formed by thermal oxidation in wet oxygen on all the surface of the silicon wafer 80, to form a conductive film 83 on the surface of the silicon dioxide film 82. On the surface of conductive film 83, a photo resist film is formed, and the photo resist film of a part on which the contact terminal 4a is to be formed is removed through the surface of the conductive film 83. A hard material is electrically coated on the conductive film 83 exposed at the aperture of the photo resist film using the conductive film 83 as an electrode, to form the contact terminal 4a and contact electrode 4b in an integrated manner. Then, the photo resist is removed. As hard coating material, nickel 8a, rhodium 8b, nickel 8c is coated in this order, to form a contact terminal 8 incorporating a contact terminal 4a and contact electrode 4b in an integrated manner.

Figure 16D:
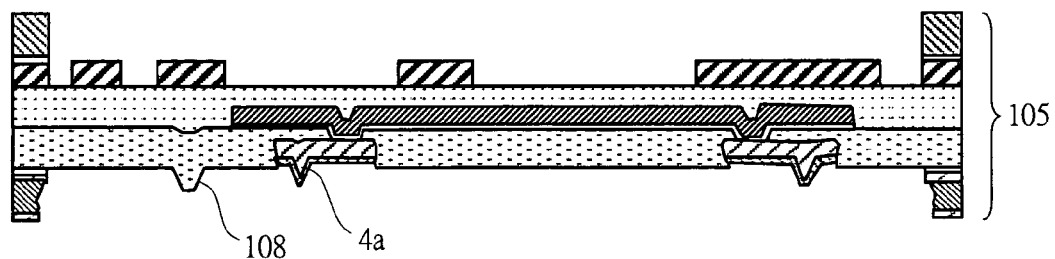
FIG. 16D is a drawing that shows another manufacturing process of forming a probe sheet in step order in the probe card according to the present invention.
Figure 16D:
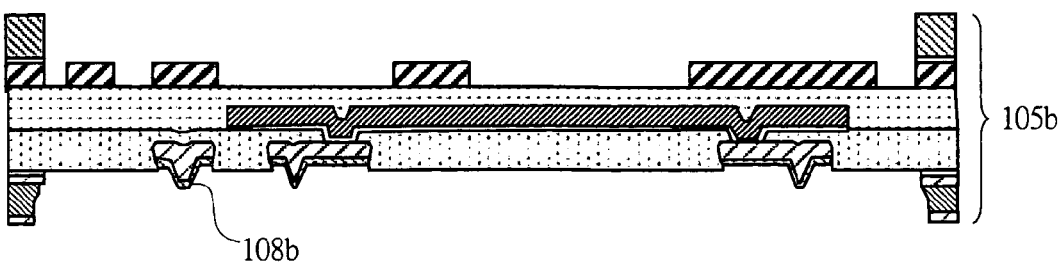

The processes shown in FIGS. 6D to 6E and FIG. 1C, then processes shown in FIGS. 6F to 6G are performed to manufacture a probe sheet structure 105 shown in FIG. 16D.

Alternatively, in the process of FIG. 16B, the photo resist film of a portion on which the dummy terminal 108 is to be formed can be removed through the surface of the conductive film 83, a dummy terminal 108b can be formed with same material as the contact terminal 8 to manufacture a probe sheet structure 105b in FIG. 16D2.

Figure 17:
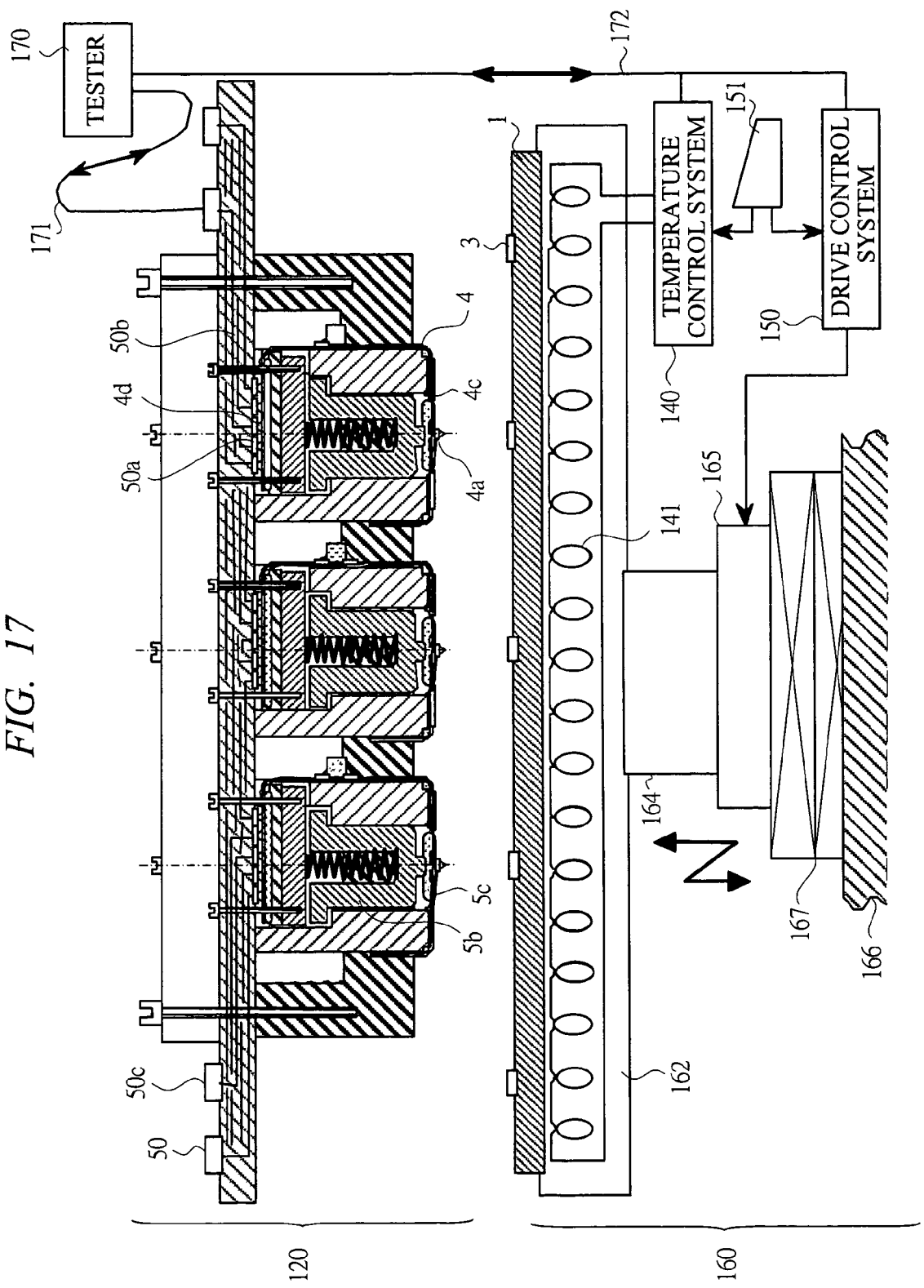
FIG. 17 is a schematic view that shows an entire structure of a test system according to one embodiment of the present invention.

An example of a semiconductor test device using a probe card (probing device) according to the invention as above will be described with reference to FIG. 17. FIG. 17 shows the general structure of a test system comprising a semiconductor test device using a probe structure shown in FIG. 2 according to the invention. The semiconductor test device using modified example of the probe structure is similar to this device.

In the general structure of the test system, the probe card is manufactured as a wafer prober. The test system comprises a specimen support system 160 that supports a semiconductor wafer 1 to be tested, a probe card 120 that contacts an electrode 3 of the wafer 1 to receive electric signals therefrom, a drive control system 150 that controls the operation of the specimen support system 160, a temperature control system 140 that controls the temperature of the wafer 1, and a tester 170 that tests the electric property of the semiconductor element (chip) 2. On the semiconductor wafer 1, a plurality of semiconductor elements (chips) are arrayed, and on the surface of semiconductor elements, a plurality of electrodes 3 are arrayed as electrodes for external connection. The specimen support system 160 comprises a specimen stage 162 that is provided horizontally to load or unload the semiconductor wafer 1, a lift axis 164 that is disposed vertically to support the specimen stage 162, a lift driving section 165 that lifts and drives the lift axis 164, and a X-Y stage 167 that supports the lift driving section 165. The X-Y stage 167 is fixed on the housing 166. The lift driving section 165 comprises a stepping motor for example. The positioning of the specimen stage 162 in horizontal and vertical directions is performed by horizontal movement of the X-Y stage 167 and vertical movement of the lift driving section 165. On the specimen stage 162, a pivoting mechanism (not shown) is provided to turn the specimen stage 162 on a horizontal plane.

A probe card 120 is disposed above the specimen stage 162. For example, the probe card 120 and a multilayered wiring substrate 50 shown in FIG. 2 are provided in parallel to the specimen stage 162. The contact terminals 4a are connected to electrodes 50c mounted on the multilayered wiring substrate 50 via wirings 4c and electrodes 4d provided on the probe sheet 4 of the probe card 120, through electrodes 50a and internal wirings 50b on the multilayered wiring substrate 50, then to a tester 170 via a cable 171.

The drive control system 150 is connected to the tester 170 via a cable 172. The drive control system 150 sends control signals the actuator of each driving section of the specimen supporting system 160 to control. That is, the drive control system 150 incorporates a computer to control the operation of the specimen support system 160 according to the progress information of the test operation of the tester 170 transmitted via the cable 172. The drive control system 150 comprises an operation section 151 to receive a variety of instructions for drive and control, for example, an instruction of manual operation.

The specimen stage 162 comprises a heater 141 that heats the semiconductor element 2. The temperature control system 140 controls the heater 141 or a cooling jig of the specimen stage 162 to control the temperature of the semiconductor wafer 1 loaded on the specimen stage 162. The temperature control system 140 comprises an operation section 151 to receive a variety of instructions for temperature control, for example, an instruction of manual operation.

Next, the operation of the semiconductor test device will be described. The semiconductor wafer 1 to be tested is loaded on the specimen stage 162 at a predetermined position. The X-Y stage 167 and the pivoting mechanism is driven and controlled to position the electrodes 3 formed on the plurality of semiconductor elements arrayed on the semiconductor wafer 1 just under a plurality of contact terminals arrayed on the probe card 120. Next, the drive control system 150 operates the lift driving section 165 to raise the specimen stage 162 from when the whole surface of the plurality of electrodes 3 contacts the tip of the contact terminals, until presses them upwards for 20 µm to 150 µm. The press block 5b having spring presses the region of the probe sheet 4 on which the contact terminals 4a are arrayed from the backside of the probe sheet 4 via the elastomer 5c to protrude the tip of the contact terminals 4a, in order to establish contact between the contact terminals and the electrode 3 arrayed on the semiconductor wafer 1 with proper load (about 3 to 150 mN per pin). Thus, the contact terminals 4 and the electrodes 3 are connected with low resistance (0.01Ω to 0.1Ω).

Next, operation power and operation test signals are sent and received between the semiconductor elements formed on the semiconductor wafer 1 and tester 170 via a cable 171, a multilayered wiring substrate 50, and contact terminals 4a to determine the operation property of the semiconductor element. A series of test operation is performed on the plurality of semiconductor elements formed on the semiconductor wafer 1 to determine the operation property thereof.

The probe sheet structure shown in FIG. 2 is described as above. The probe sheet structure is applicable to any of the probe cards as above.

Next, another application of the test method using the semiconductor test device as above will be described with reference to FIG. 18.

Figure 18A:
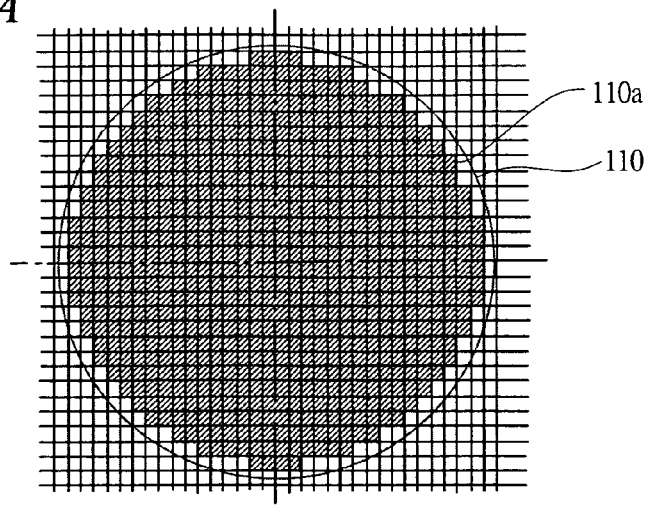
FIG. 18A is a plan view that shows an example of a semiconductor element forming region on a wafer that is an object to be tested.
Figure 18B:
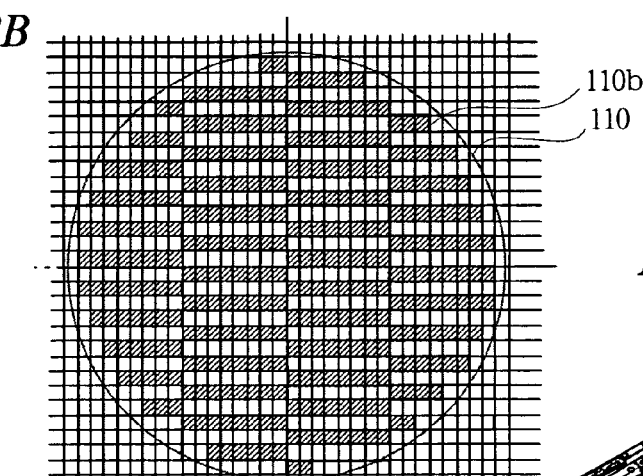
FIG. 18B is a plan view that shows an example of discrete arrangement of semiconductor element groups when a plurality of tests are conducted on the wafer that is an object to be detected.
Figure 18D:
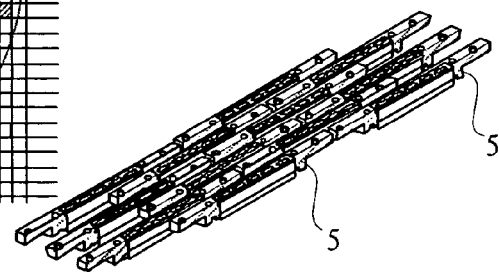
FIG. 18D is a perspective view that shows an example of the probe sheet adhesion holder constituted by adhering with the probe sheets so as to correspond to the discretely arranged semiconductor element groups.
Figure 18C:
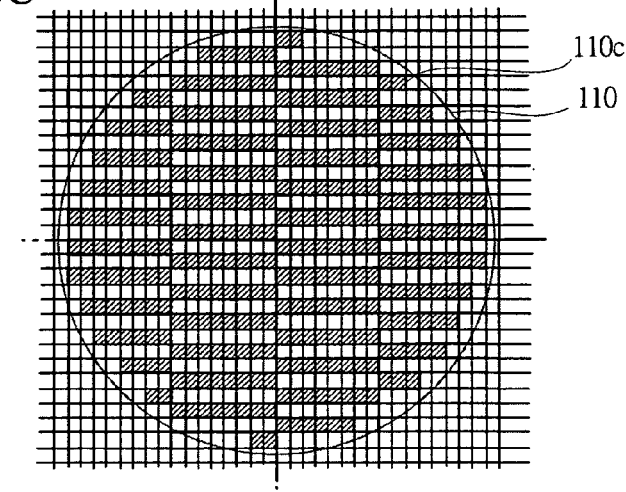
FIG. 18C is a plan view showing an example of forming a pair with the case shown in FIG. 18B in which the semiconductor element groups are discretely arranged when the plurality of tests are conducted on the wafer that is an object to be detected.

FIG. 18A is a plan view that shows a semiconductor elements forming region 110a on the wafer 110 to be tested. As a probe to test the semiconductor element forming region 110a, according to pattern of semiconductor device group, one or more type of probe card can be manufactured incorporating probe sheet adhesion holders that contact discrete semiconductor elements 110b and 110c (shadowed area in the drawing) as shown in FIG. 18B and 18C. The probe card is used one-by-one to test whole area of the semiconductor element forming region 110a. For example, as shown in FIG. 18D, rectangle probe sheet adhesion holders are arrayed and fixed on the multilayered wiring substrate (not shown), the wafer support stage is moved by one chip in Y direction, then the stage is moved by the number of chips formed on one probe sheet structure in X direction. The semiconductor element groups 110b and 110c are tested one-by-one as shown in FIG. 18, and the whole wafer will be tested by two test operations. Thus, the all the chips on the semiconductor element forming region 110a can be tested with minimum touch down, and the test efficiency is improved.

Alternatively, more than two touch downs can be used.

In the prove sheet adhesion holder according to the invention, a plurality of probe sheet adhesion holders are combined in accordance to the general arrangement of the semiconductor elements (chips) formed on the wafer to be tested. Thus, the arrangement of the contact terminals is highly flexible. Therefore, the efficient movement pattern can be selected in order to minimize the chip area that is probed twice at each touch down. Therefore, a highly efficient test device with reduced number of touch down can be designed and constructed.

If a probe sheet adhesion holder in a semiconductor test device is designed according to the arrangement of all semiconductor elements formed on the wafer to be tested, any area on the chip pad will not be probed twice. Thus, a probing-mark on the wafer pad can be minimized, thus the reliability of a wire bond or a bump formation in the subsequent process can be improved.

In this structure, when the contact terminal on the probe sheet structure protrudes into a region on which a chip is not formed, damage to the wafer and the contact terminal can be prevented. This is because as the contact terminal is pressed by an independent spring vertically from backside of the probe sheet, the increase in the load is less than about 10% even for a stroke at several hundreds µm stroke, the contact terminal contacting to the wafer contacts with substantially constant load determined in advance, and no excessive load is applied to a terminal out of contact.

As described above, in the probe sheet structure according to the embodiment, when a probe sheet is manufactured according to manufacturing processes shown in FIGS. 2 to 16, the contact terminal 4a can have a pyramid-shape or a truncated pyramid-shape. Unlike the contact of semi-sphere shaped coated bump or planer electrode as in conventional techniques, a hard contact terminal can pierce the oxides or impurities on the surface of the electrode with lower contact pressure, and the contact terminal can contact genuine metal electrode material. Thus, stable contact characteristic value can be obtained. Also, the probe sheet is formed by a photo-lithograph process lined by a metal film 90 having same linear expansion coefficient as the silicon wafer. Even for a large contact area, the contact terminals of the probe sheet and electrodes of the semiconductor elements can contact with high accuracy.

The invention of the inventor has been described in detail based on the particular embodiments. However, the invention is not limited to the above embodiments. A variety of modifications can be made on the disclosed embodiment without departing from the true spirit of the invention. For example, in this embodiment, a probe card adhesion holder having a structure shown in FIG. 2 is used for a probe card. However, a probe sheet structure as shown in FIGS. 4 to 16 can also be used.

Figure 19:
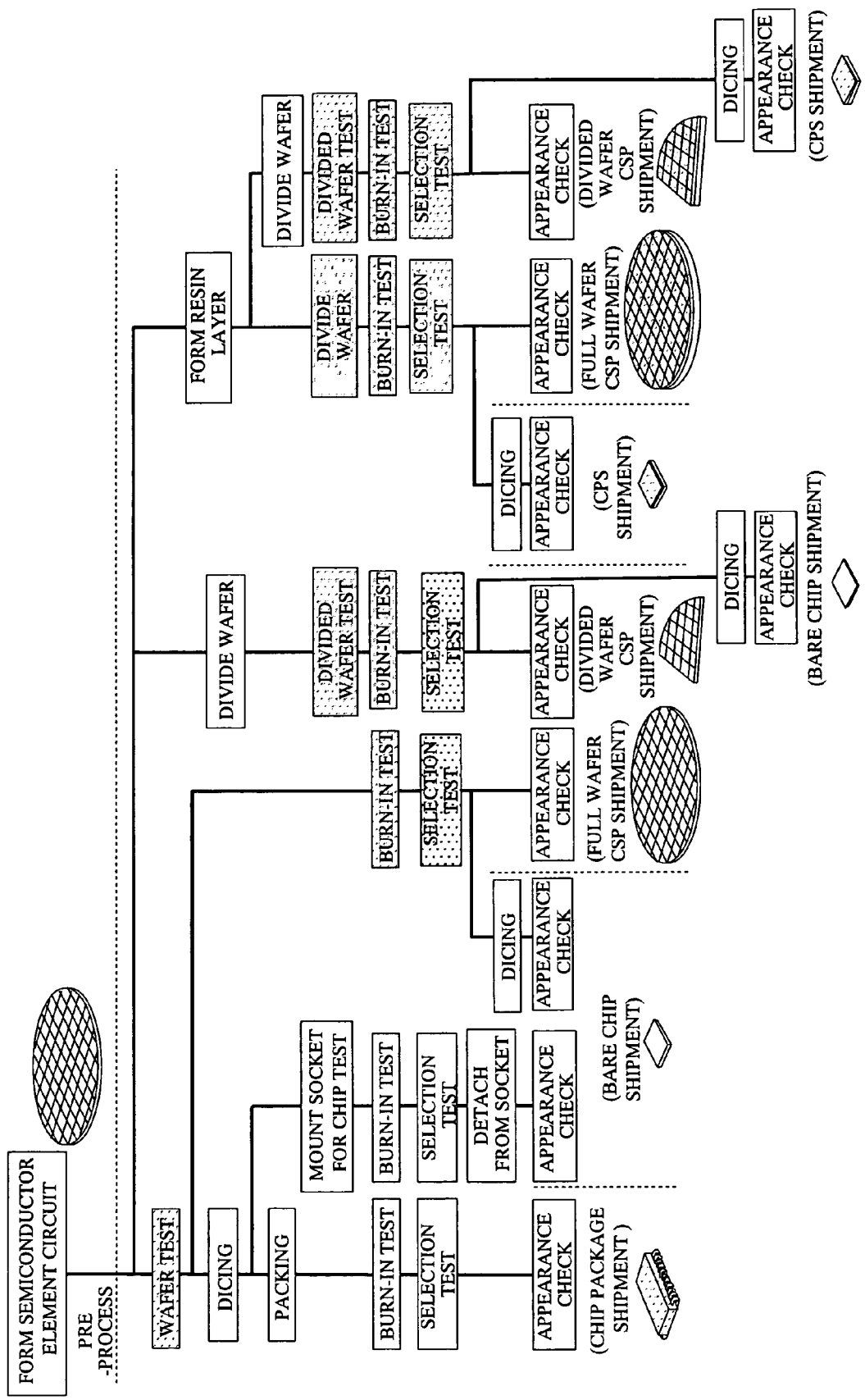
FIG. 19 shows a process drawing showing a manufacturing process of a semiconductor device including a test step using the semiconductor test device according to the present invention.
Figure 20A:
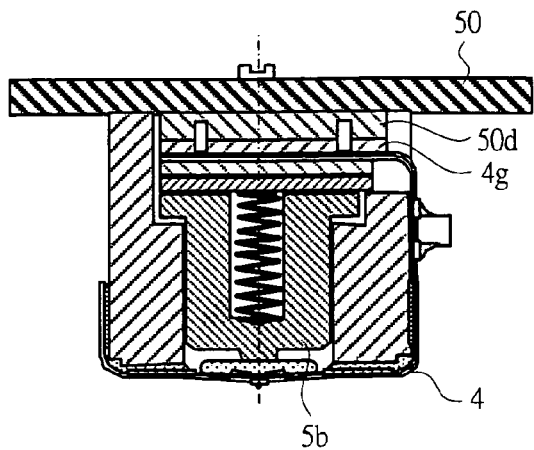
FIG. 20A is a cross-sectional view that shows a main portion of another example in which a pressing method of the probe card or a leading method of the probe sheet according to the present invention is different.
Figure 20B:
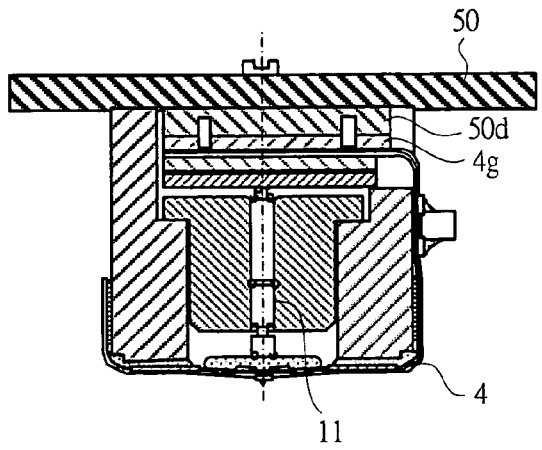
FIG. 20B is a cross-sectional view that shows a main portion of another example in which a pressing method of the probe card or a leading method of the probe sheet according to the present invention is different.
Figure 20C:
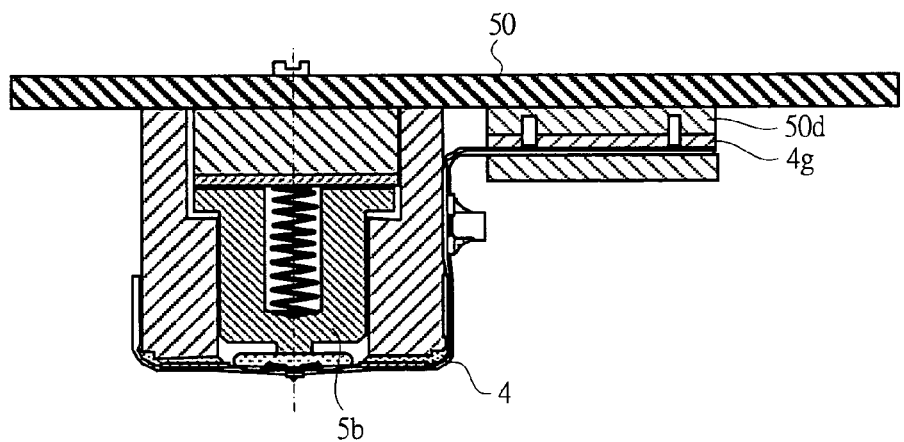
FIG. 20C is a cross-sectional view that shows a main portion of another example in which a pressing method of the probe card or a leading method of the probe sheet according to the present invention is different.
Figure 20D:
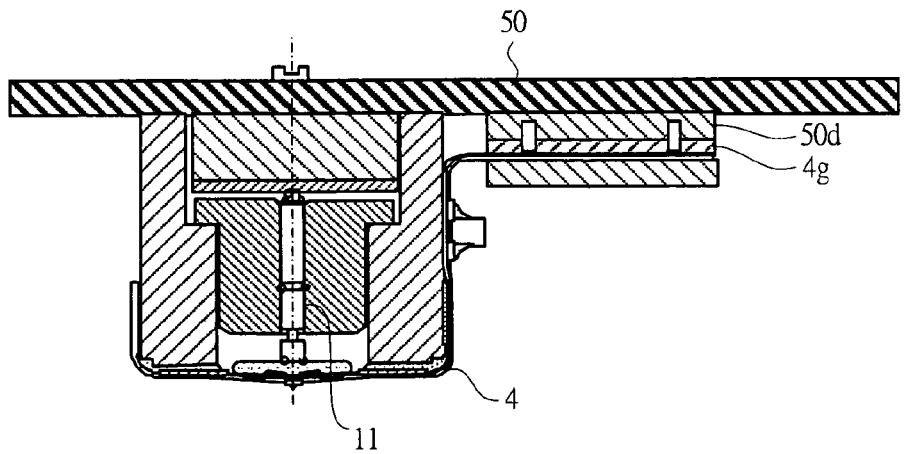
FIG. 20D is a cross-sectional view that shows a main portion of another example in which a pressing method of the probe card or a leading method of the probe sheet according to the present invention is different.
Figure 21A:
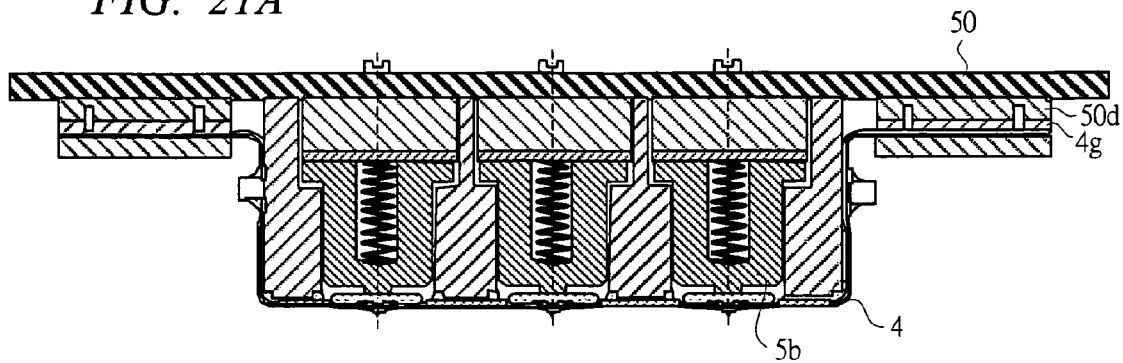
FIG. 21A is a cross-sectional view that shows a main portion of another example in which a pressing method of the probe card or a leading method of the probe sheet according to the present invention is different.
Figure 21B:
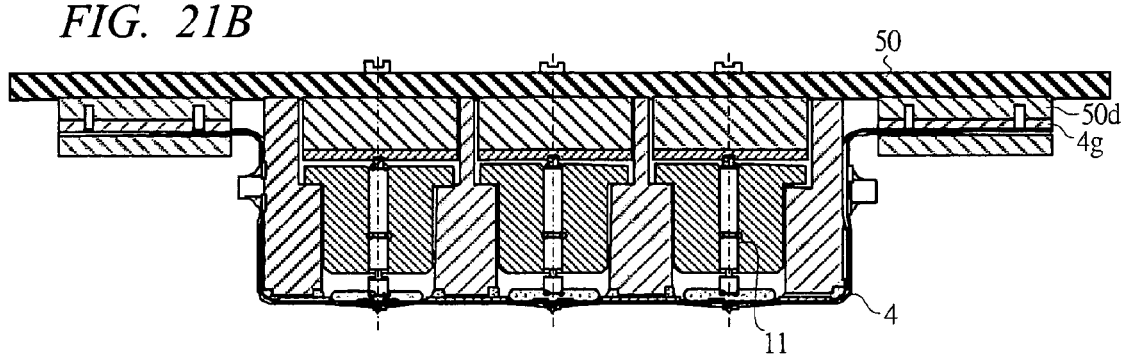
FIG. 21B is a cross-sectional view that shows a main portion of another example in which a pressing method of the probe card or a leading method of the probe sheet according to the present invention is different.
Figure 21C:
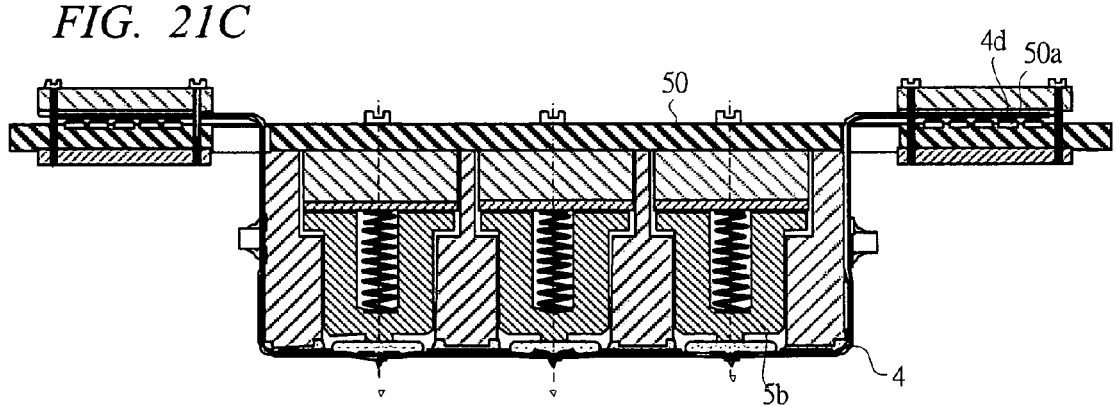
FIG. 21C is a cross-sectional view that shows a main portion of another example in which a pressing method of the probe card or a leading method of the probe sheet according to the present invention is different.
Figure 21D:
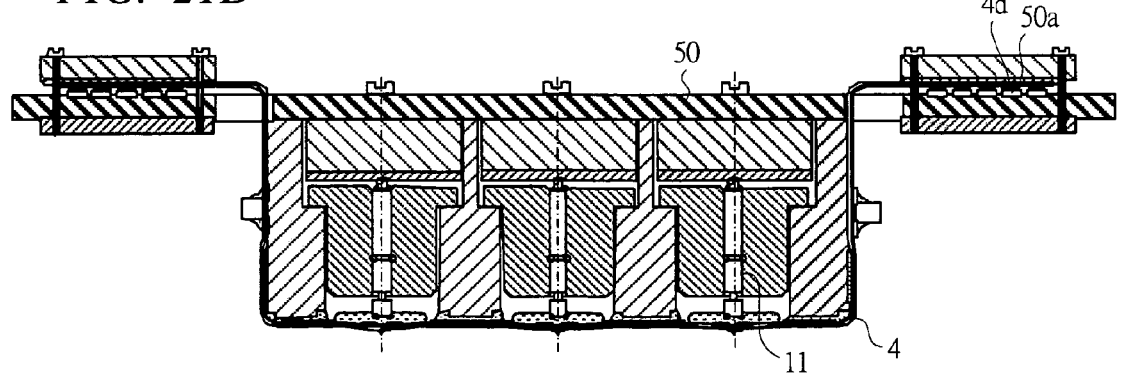
FIG. 21D is a cross-sectional view that shows a main portion of another example in which a pressing method of the probe card or a leading method of the probe sheet according to the present invention is different.
Figure 22A:
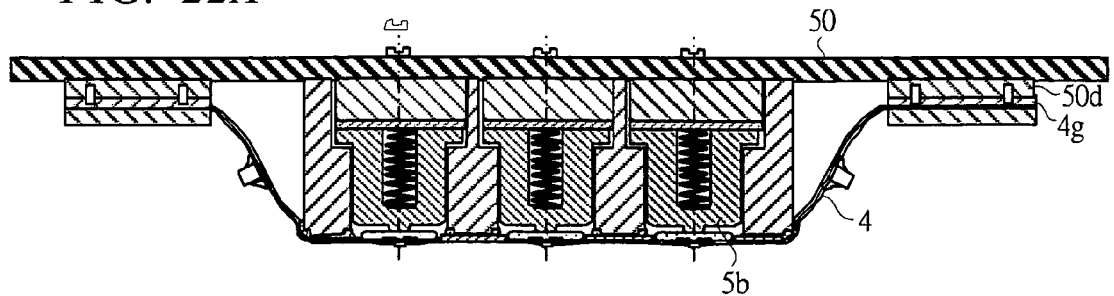
FIG. 22A is a cross-sectional view that shows a main portion of another example in which a pressing method of the probe card or a leading method of the probe sheet according to the present invention is different.
Figure 22B:
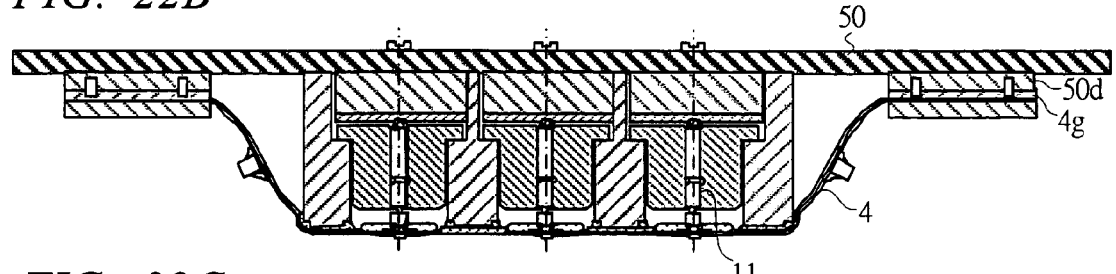
FIG. 22B is a cross-sectional view that shows a main portion of another example in which a pressing method of the probe card or a leading method of the probe sheet according to the present invention is different.
Figure 22C:
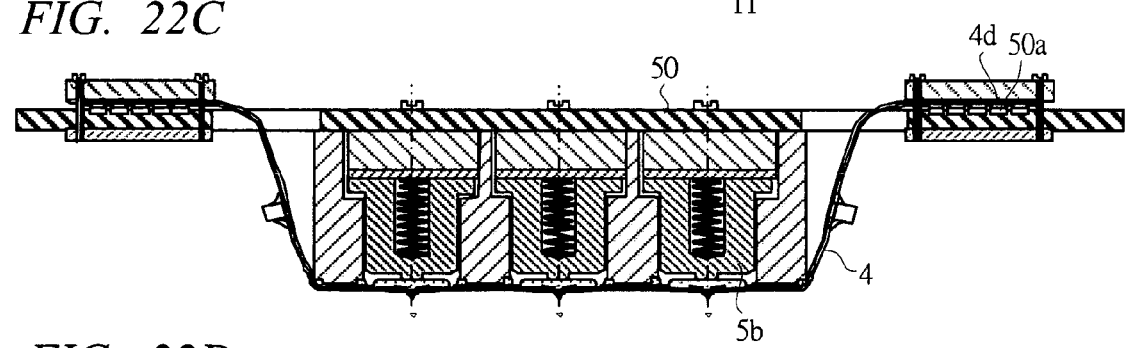
FIG. 22C is a cross-sectional view that shows a main portion of another example in which a pressing method of the probe card or a leading method of the probe sheet according to the present invention is different.
Figure 22D:
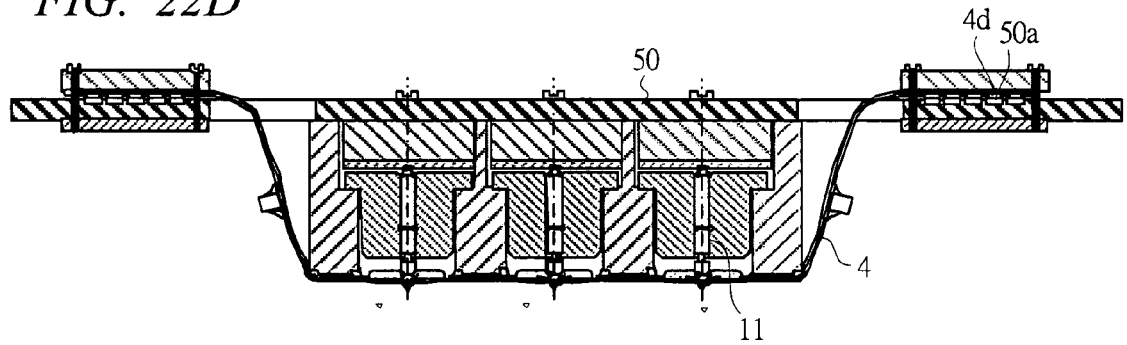
FIG. 22D is a cross-sectional view that shows a main portion of another example in which a pressing method of the probe card or a leading method of the probe sheet according to the present invention is different.
Figure 22E:
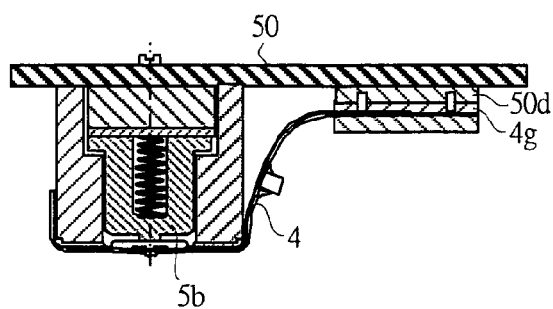
FIG. 22E is a cross-sectional view that shows a main portion of another example in which a pressing method of the probe card or a leading method of the probe sheet according to the present invention is different.
Figure 22F:
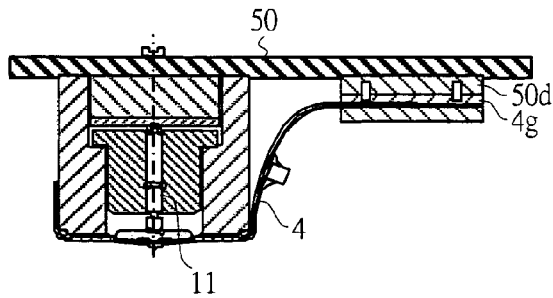
FIG. 22F is a cross-sectional view that shows a main portion of another example in which a pressing method of the probe card or a leading method of the probe sheet according to the present invention is different.

Finally, representative manufacturing methods of semiconductor device including a test step or a test method using the semiconductor test device as described above will be described with reference to FIG. 19.

(1) A manufacturing method of a semiconductor device according to the invention comprises the steps of: forming circuits on a wafer to form a semiconductor device (forming semiconductor element circuits); testing the electric property of a plurality of semiconductor elements collectively at wafer level using the semiconductor test device according to the invention (wafer test); cutting the wafer into separate semiconductor element (dicing); and sealing the semiconductor element with resin (assembly, sealing). Then, the device undergoes a burn-in test, a selection test, an appearance test, and is shipped as a chip package.

(2) A manufacturing method of a semiconductor device according to the invention comprises steps of: forming circuits on a wafer to form a semiconductor element (forming semiconductor element circuits); testing the electric property of a plurality of semiconductor elements collectively at wafer level using the semiconductor test device according to the invention (wafer test); and cutting the wafer into separate semiconductor element (dicing). Then, the socket for chip test is mounted, the device undergoes burn-in and selection tests are conducted, the socket is removed, and the device undergoes an appearance test and is shipped as a bear chip product.

(3) A manufacturing method of a semiconductor device according to the invention comprises steps of: forming circuits on a wafer to form a semiconductor device (forming semiconductor element circuits); and testing the electric property of a plurality of semiconductor devices collectively at wafer level using the semiconductor test device according to the invention (wafer test). Then the device undergoes a burn-in test, a selection test, and an appearance test, and is shipped as a full-wafer product. The burn-in test and the selection test is performed using the semiconductor test device according to the invention.

(4) A manufacturing method of a semiconductor device according to the invention comprises steps of: forming circuits on a wafer to form a semiconductor device (forming semiconductor element circuits); and testing the electric property of a plurality of semiconductor devices collectively at wafer level using the semiconductor test device according to the invention (wafer test). Then, the device undergoes a burn-in test and an appearance test. Then the wafer is separated into each semiconductor element (dicing) and undergoes an appearance test, then is shipped as a bear chip product. The burn-in test and the selection test is performed using the semiconductor test device according to the invention.

(5) A manufacturing method of a semiconductor device according to the invention comprises steps of: forming circuits on a wafer to form a semiconductor device (forming semiconductor element circuits); separating the wafer (wafer separation); and testing the electric property of a plurality of semiconductor devices collectively at separated wafer level using the semiconductor test device according to the invention (separated wafer test). Then, the device undergoes a burn-in, a selection test, an appearance test, and is shipped as a separated wafer product. The burn-in test and the selection test is performed using the semiconductor test device according to the invention.

(6) A manufacturing method of a semiconductor device according to the invention comprises steps of: forming circuits on a wafer to form a semiconductor device (forming semiconductor element circuits); separating the wafer (wafer separation); and testing the electric property of a plurality of semiconductor devices collectively at separated wafer level using the semiconductor test device according to the invention (separated wafer test). Then, the device undergoes a burn-in, a selection test. Then the separated wafer is cut into each semiconductor elements (dicing), and the device undergoes an appearance test and is shipped as a bear chip product. The burn-in test and the selection test is performed using the semiconductor test device according to the invention.

(7) A manufacturing method of a semiconductor device according to the invention comprises steps of: forming circuits on a wafer to form a semiconductor device (forming semiconductor element circuits); forming a resin layer on the wafer (forming resin layer); testing the electric property of a plurality of semiconductor elements formed on a wafer on which the resin layer is formed; and collectively using the semiconductor test device according to the invention (wafer test). Then the device undergoes a burn-in test and a selection test. The wafer is separated into each semiconductor element (dicing), undergoes an appearance test, and is shipped as a CSP product. The burn-in test and the selection test is performed using the semiconductor test device according to the invention.

(8) A manufacturing method of a semiconductor device according to the invention comprises steps of: forming circuits on a wafer to form a semiconductor device (forming semiconductor element circuits); forming a resin layer on the wafer (forming resin layer); and testing the electric property of a plurality of semiconductor elements formed on a wafer on which the resin layer is formed; collectively using the semiconductor test device according to the invention (wafer test). Then the device undergoes a burn-in test, a selection test, and an appearance test, and is shipped as a full-wafer CSP product. The burn-in test and the selection test is performed using the semiconductor test device according to the invention.

(9) A manufacturing method of a semiconductor device according to the invention comprises steps of: forming circuits on a wafer to form a semiconductor device (forming semiconductor element circuits); forming a resin layer on the wafer (forming resin layer); separating the wafer on which the resin layer is formed (separating wafer); and testing the electric property of a plurality of semiconductor devices, collectively at separated wafer level using the semiconductor test device according to the invention (separated wafer test). Then the device undergoes a burn-in test, a selection test, and an appearance test, and is shipped as a separated wafer CSP product. The burn-in test and the selection test is performed using the semiconductor test device according to the invention.

(10) A manufacturing method of a semiconductor device according to the invention comprises steps of: forming circuits on a wafer to form a semiconductor device (forming semiconductor element circuits); forming a resin layer on the wafer (forming resin layer); separating the wafer on which the resin layer is formed (separating wafer); and testing the electric property of a plurality of semiconductor devices, collectively at separated wafer level using the semiconductor test device according to the invention (separated wafer test). Then the device undergoes burn-in and a selection test. Then the wafer is cut into each semiconductor element (dicing), undergoes an appearance test, and is shipped as a CSP product. The burn-in test and the selection test is performed using the semiconductor test device according to the invention.

In the process to test the electric property of the semiconductor element in the manufacturing method of the semiconductor device as described, the probe card according to the invention is used to improve the contact characteristics with high position accuracy.

Particularly, the test is performed using a contact terminal 4a shaped in a pyramid or truncated pyramid by coating using a hole formed by anisotropic etching of the crystalline substrate, as a cast. Thus, stable contact characteristic can be obtained with low contact pressure. The test can be performed without damage on the underlying semiconductor element. Also, as a plurality of contact terminals 4a has a structure in which the terminals 4a are surrounded by a metal film 90 having same linear expansion coefficient as the wafer 1, excessive stress is not applied to the contact terminal during test, and highly accurate contact of electrode 3 of the wafer 1 can be achieved.

The pressure trace on the electrode of the semiconductor element is as small as a point (concave point having pyramid-shape or truncated pyramid-shape). The surface of the electrode has planer region substantially free from pressure trace. Therefore, a plurality of tests involving contact to the electrode as in the tests process shown in FIG. 19 can be performed.

Particularly, the probe sheet 4 incorporating test components has a structure in which protruding contact terminals are pressed to contact the test electrode of the semiconductor device. Even if a plurality of tests are to be performed including an initial property test, burn-in, and a selection test, the damage on the pad can be avoided and the probing trace of wafer 1 on the electrode 3 can be minimized. Thus, the reliability of the subsequent connection process of the semiconductor element (wire bonding, forming a solder bump or a gold bump, bonding of gold and tin) can be improved.

As the contact terminals having a pyramid-shape or a truncated pyramid-shape formed on a flexible thin film probe sheet 4 contact the electrode of the wafer by a combination of probe sheet adhesion holders, the contact terminal can contact the electrode by a simple pressing mechanism. Thus, a stable contact resistance value can be obtained even for a large area.

By using thin film wiring circuit technology, necessary components (e.g. capacitor, resistor, fuse, connector) can be disposed and installed near the contact terminal with ease. Thus, stable test and circuit can be obtained.

The invention by the inventor was described with reference to its particular embodiments. However, it can be appreciated that the invention is not limited to the disclosed embodiments, rather, a variety of modifications can be made without departing from spirit of the invention.

Next, representative effects achieved by the invention will be briefly described.

(1) A test device can be provided that has accurate positioning of the contact terminal tip, and that can accurately test a semiconductor element having a plurality of test electrodes that are scattered in a wide area with narrow pitch.

(2) A test device can be provided that has a structure in which individual contact terminal or terminals is vertically pressed by independent spring from backside of the probe sheet. Increase in the load is less then about 10% even for several hundred μm stroke, the contact terminal can contact with substantially constant load predetermined in advance. The contact terminal can contact with a constant load a plurality of test electrodes that are scattered in wide area with narrow pitch. Thus, the test device can accurately test the semiconductor element.

(3) A manufacturing method of semiconductor device is provided that can provide a structure in which electric components for test circuit can be mounted near the contact terminal. This structure improves connection to the electrode, and electric property and reliability.

(4) According to the invention, a probe sheet on which contact terminals are formed is adhered to an independent contact holder to make individual probe sheet adhesion holder, and one or more probe sheet adhesion holders are combined to form a probe card. Therefore, the pattern can be flexibly designed and individual probe sheet can be replaced with ease. Thus, the device is easily assembled. The assembly cost and maintenance cost of the test device, and the semiconductor device test process cost can be at low cost. Thus, the manufacturing method of semiconductor device according to the invention can be low manufacturing cost of the semiconductor device as a whole.

(5) According to the invention, the individual spring presses vertically individual contact terminal or terminals from backside of the probe sheet even when a semiconductor element (chip) on the edge of a wafer is to be probed. Therefore, no excessive load is applied to the terminal that does not contact, thus, damage on the wafer and the contact terminal can be avoided. The invention may be embodied in other specific forms without departing from the sprit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A probe card to permit simultaneous testing of a plurality of chips on a wafer comprising:
    a plurality of probe sheets each including a contact terminal to respectively contact with electrode pads for said chips provided on said wafer, a wiring led from the contact terminal, and a sheet electrode electrically connected to the wiring;
    a plurality of holders to hold the respective probe sheets; and
    a multilayered wiring substrate to hold the holders and including a plurality of substrate electrodes each respectively electrically connected to one of the sheet electrodes of the probe sheets,
    wherein an interior of each of the holders is provided with a pressing mechanism to individually press the corresponding contact terminal provided in each of the probe sheets from a rear end side of the contact terminal to respectively contact said electrode pads of said chips on said wafer.

2. The probe card according to claim 1,
    wherein the pressing mechanism comprises a spring probe.

3. The probe card according to claim 1,
    wherein the pressing mechanism comprises a press block and a spring.

4. The probe card according to claim 1,
    wherein the plurality of holders are removable from the multilayered wiring substrate.

5. The probe card according to claim 1,
    wherein the plurality of holders are disposed based on a positional relation corresponding to a semiconductor element forming region of the wafer, and held by the multilayered wiring substrate.

6. The probe card according to claim 1, wherein each of the plurality of probe sheets is held in a state of being bent along each outer periphery of the plurality of holders.

7. The probe card according to claim 1, wherein the contact terminal is a terminal with a triangular-pyramid shape or truncated pyramid shape.

8. The probe card according to claim 1, wherein the contact terminal is formed using a hole formed by anisotropic etching of a crystalline substance as a mold shape.

9. The probe card according to claim 1, wherein each of the plurality of probe sheets is provided with a metal sheet having a linear expansion coefficient of 1 ppm/° C. to 6 ppm/° C.

10. A probe card to permit simultaneous testing of a plurality of chips on a wafer comprising:
    a plurality of probe sheets each including a contact terminal to respectively contact with electrode pads for said chips provided on said wafer, a wiring led from the contact terminal, and a sheet mounting connector electrically connected to the wiring;
    a plurality of holders to hold the respective probe sheets; and
    a multilayered wiring substrate to hold the holders and including a plurality of multilayered substrate mounting connectors each respectively electrically connected to one of the sheet mounting connectors of each of the probe sheets,
    wherein an interior of each of the holders is provided with a pressing mechanism which presses the contact terminal provided in each of the probe sheets from a rear end side of the contact terminal to respectively contact said electrode pads of said chips on said wafer.

11. The probe card according to claim 10, wherein the pressing mechanism comprises a spring probe.

12. The probe card according to claim 10, wherein the pressing mechanism comprises a press block and a spring.

13. The probe card according to claim 10, wherein the plurality of holders are removable from the multilayered wiring substrate.

14. The probe card according to claim 10, wherein the plurality of holders are disposed based on positional relation corresponding to a semiconductor element forming region of the wafer, and held by the multilayered wiring substrate.

15. The probe card according to claim 10, wherein each of the plurality of probe sheets is held in a state of being bent along each outer periphery of the plurality of holders.

16. The probe card according to claim 10, wherein the contact terminal is a terminal with a triangular-pyramid shape or truncated pyramid shape.

17. The probe card according to claim 10, wherein the contact terminal is formed using a hole formed by anisotropic etching of a crystalline substance as a mold shape.

18. The probe card according to claim 10, wherein each of the plurality of probe sheets is provided with a metal sheet having a linear expansion coefficient of 1 ppm/° C. to 6 ppm/° C.

* * * * *